(12) United States Patent
Xin et al.

(10) Patent No.: US 11,037,615 B2
(45) Date of Patent: Jun. 15, 2021

(54) REFRESH PROCESSING METHOD, APPARATUS, AND SYSTEM, AND MEMORY CONTROLLER

(71) Applicant: Huawei Technologies Co., Ltd., Shenzhen (CN)

(72) Inventors: Hengchao Xin, Shenzhen (CN); Jing Xia, Shenzhen (CN); Yining Li, Shenzhen (CN); Zhenxi Tu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/932,255

(22) Filed: Jul. 17, 2020

(65) Prior Publication Data

US 2020/0357457 A1  Nov. 12, 2020

Related U.S. Application Data

(63) Continuation of application No. PCT/CN2018/123223, filed on Dec. 24, 2018.

(30) Foreign Application Priority Data

Jan. 19, 2018  (CN) .......................... 201810052939.0

(51) Int. Cl.
*G11C 11/406* (2006.01)

(52) U.S. Cl.
CPC .................. *G11C 11/406* (2013.01)

(58) Field of Classification Search
None
See application file for complete search history.

(56) References Cited

U.S. PATENT DOCUMENTS 9,001,608 B1 * 4/2015 Chishti ............ G11C 11/40611
365/222
2011/0107022 A1  5/2011 Gray et al.
2012/0263003 A1  10/2012 Sakakibara et al.
2013/0332669 A1  12/2013 Matsumoto
(Continued)

FOREIGN PATENT DOCUMENTS

CN  103038754 A  4/2013
CN  103996411 A  8/2014
CN  105489240 A  4/2016
(Continued)

*Primary Examiner* — James G Norman
(74) *Attorney, Agent, or Firm* — Leydig, Voit & Mayer, Ltd.

(57) ABSTRACT

A refresh processing method, apparatus, and system, and memory controllers are provided, to improve memory access efficiency. The refresh processing apparatus includes a plurality of memory controllers that are in one-to-one correspondence with a plurality of memory spaces. Any first memory controller in the plurality of memory controllers is configured to: receive N first indication signals and N second indication signals that are output by N memory controllers other than the first memory controller, where N is greater than or equal to 1; and determine a refresh policy of a first memory space based on at least one of the following information: the N first indication signals, the N second indication signals, and refresh indication information of the first memory space.

16 Claims, 8 Drawing Sheets

(56) References Cited

U.S. PATENT DOCUMENTS

2016/0224272 A1 8/2016 Kim
2017/0278561 A1 9/2017 Oh et al.

FOREIGN PATENT DOCUMENTS

| CN | 105679360 A | 6/2016 |
| CN | 105810235 A | 7/2016 |
| CN | 107015628 A | 8/2017 |
| CN | 107527648 A | 12/2017 |

* cited by examiner

REFRESH PROCESSING METHOD, APPARATUS, AND SYSTEM, AND MEMORY CONTROLLER

CROSS-REFERENCE TO RELATED APPLICATIONS

This application is a continuation of International Application No. PCT/CN2018/123223, filed on Dec. 24, 2018, which claims priority to Chinese Patent Application No. 201810052939.0, filed on Jan. 19, 2018. The disclosures of the aforementioned applications are hereby incorporated by reference in their entireties.

TECHNICAL FIELD

This application relates to the field of storage technologies, and in particular, to a refresh processing method, apparatus, and system, and a memory controller.

BACKGROUND

Due to excellent performance, a dynamic random access memory (DRAM) is widely applied to computer devices as a memory chip. The DRAM stores data by using charges in a capacitor. However, the charges constantly leak away due to electric leakage. Therefore, data in the capacitor needs to be regularly read and rewritten, to compensate for charges that leak away, and avoid a data loss, and this operation is referred to as refreshing. Refreshing is controlled by a memory controller (MC). A processor may include a plurality of MCs, and each MC corresponds to a part of a memory space, and controls refreshing of the memory space corresponding to the MC. A set of one MC and a memory space corresponding to the MC may be referred to as a channel. When each channel is refreshed, the channel is idle, to be specific, no data is transmitted through the channel.

In the prior art, when a memory chip is refreshed, a plurality of channels are independently refreshed, to be specific, each MC independently controls refreshing of a memory space corresponding to the MC. The following uses FIG. 1 as an example for description. In FIG. 1, CH0, CH1, CH2, and CH3 represent four channels. In a time sequence diagram of each channel, a time point marked with a vertical line is used to represent a time point of refreshing the channel. Because each channel is independently refreshed, it is difficult to refresh the plurality of channels at the same time.

When a memory address is continuously accessed, access within a short time is interleaved to all the channels. If the plurality of channels are independently refreshed, if any channel in a system is in a refreshed state when the memory address is continuously accessed, a transient stream interruption may occur in the system due to access to the memory address. Therefore, in the foregoing solution, because the plurality of channels are independently refreshed, there is a relatively high probability of a stream interruption in a system, affecting memory access efficiency.

In conclusion, an existing refresh method has a memory access efficiency problem.

SUMMARY

Embodiments of this application provide a refresh processing method, apparatus, and system, and a memory controller, to improve memory access efficiency.

According to a first aspect, an embodiment of this application provides a refresh processing apparatus. The refresh processing apparatus includes a plurality of memory controllers. The plurality of memory controllers are in one-to-one correspondence with a plurality of memory spaces, and respectively control the memory spaces corresponding to the plurality of memory controllers, and any two of the plurality of memory controllers are communicatively connected.

A first memory controller in the plurality of memory controllers is configured to:

separately output a first indication signal and a second indication signal to N memory controllers other than the first memory controller in the plurality of memory controllers, where N is greater than or equal to 1; and determine a refresh policy of a first memory space based on at least one of the following information: N first indication signals and N second indication signals that are respectively output by the N memory controllers, and refresh indication information of the first memory space.

The first indication signal is used to indicate whether the first memory space controlled by the first memory controller is to be forcibly refreshed. The second indication signal is used to indicate whether the first memory space is idle. The refresh indication information of the first memory space includes at least one of the following: an under-refresh quantity of times of the first memory space, used to indicate a quantity of times that the first memory space is not refreshed at a preset refresh time; input and output data traffic of the first memory space; and the second indication signal of the first memory controller. The first memory controller is any one of the plurality of memory controllers.

By using the refresh processing apparatus provided in the first aspect, the first memory controller no longer independently controls refreshing of the first memory space, but determines the refresh policy of the first memory space by comprehensively considering information about whether a plurality of memory spaces are being forcibly refreshed and whether the plurality of memory spaces are idle indicated by first indication signals and second indication signals of memory spaces correspondingly controlled by the N memory controllers other than the first memory controller, and the refresh indication information of the first memory space. According to this solution, the first memory controller may consider other memory spaces when determining the refresh policy of the first memory space, and therefore may integrate information about the plurality of memory spaces to determine the refresh policy of the first memory space, thereby improving a probability that the plurality of memory spaces are synchronously refreshed. In a scenario with continuous memory access, according to the foregoing solution, a probability that any one of the plurality of memory spaces is in a refreshed state can be reduced, to reduce a probability that based on an access request separately sent to a plurality of channels, stream interruption occurs in a system because a memory space is in a refreshed state; and then, memory access efficiency is improved, and system performance is improved.

When the first memory controller determines the refresh policy of the first memory space based on the N first indication signals, the N second indication signals, and the at least one type of information in the refresh indication information of the first memory space, there may be different implementations under different conditions and scenarios. The following describes five of the implementations.

Implementation 1

If any one of the N first indication signals indicates that a memory space controlled by a corresponding memory controller is being forcibly refreshed, the first memory controller determines to refresh the first memory space.

According to the foregoing solution, on the one hand, the under-refresh quantity of times of the first memory space can be reduced, to reduce a data loss risk; and on the other hand, because the first memory space is synchronously refreshed with the memory space that is being forcibly refreshed, when the memory subsequently needs to be continuously accessed, an access request is separately sent to a plurality of channels. According to the foregoing solution, the probability that any one of the plurality of memory spaces is in a refreshed state can be reduced, to reduce the probability that based on the access request separately sent to the plurality of channels, stream interruption occurs in the system because a memory space is in a refreshed state.

Implementation 2

If any one of the N first indication signals indicates that a memory space controlled by a corresponding memory controller is being forcibly refreshed, the first memory controller determines, when the refresh indication information of the first memory space meets a preset condition, to refresh the first memory space.

The preset condition includes at least one of the following: The under-refresh quantity of times is greater than or equal to a preset refresh threshold (for example, the preset refresh threshold may be 6); the input and output data traffic of the first memory space is less than a preset traffic threshold; and the first memory space is idle.

According to the foregoing solution, if another memory space is being forcibly refreshed, the first memory controller conditionally controls the first memory space to be refreshed, which not only can consider data transmission of the first memory space when the preset condition is not met, but also can reduce the under-refresh quantity of times of the first memory space when the preset condition is met. Therefore, a data loss risk is reduced. Meanwhile, if the first memory space is refreshed when the preset condition is met, because the first memory space is synchronously refreshed with the memory space that is being forcibly refreshed, when the memory subsequently needs to be continuously accessed, an access request is separately sent to a plurality of channels. According to the foregoing solution, the probability that any one of the plurality of memory spaces is in a refreshed state can be reduced, to reduce the probability that based on the access request separately sent to the plurality of channels, stream interruption occurs in the system because a memory space is in a refreshed state.

Implementation 3

If any one of the N first indication signals indicates that any memory space controlled by a corresponding memory controller is not forcibly refreshed, and the under-refresh quantity of times of the first memory space is greater than or equal to a second threshold and less than a first threshold, the first memory controller determines, when the first memory space is idle, to refresh the first memory space.

According to the foregoing solution, if none of other memory spaces is forcibly refreshed, and a level of the under-refresh quantity of times of the first memory space is medium, there is no urgent need to forcibly refresh all the plurality of memory spaces. Therefore, the first memory space may be independently refreshed based on whether the first memory space is idle: If the first memory space is idle, the first memory space may be refreshed; or if the first memory space is in a data transmission state, the first memory space may not be refreshed, and in this case, the under-refresh quantity of times of the first memory space continues to increase. Because the under-refresh quantity of times of the first memory space is at a medium level, an increase in the under-refresh quantity of times does not directly cause an excessively long interval of refreshing, to be specific, does not cause a data loss.

In a possible design, that the first memory controller determines, when the first memory space is idle, to refresh the first memory space may be specifically implemented in the following manner: The first memory controller determines idle waiting duration based on the under-refresh quantity of times of the first memory space; and when the first memory space is switched from a data transmission state to an idle state, the first memory controller determines to refresh the first memory space after waiting for the idle waiting duration.

Usually, when the first memory controller determines the idle waiting duration, a larger under-refresh quantity of times of the first memory space indicates longer determined idle waiting duration. This is because if the under-refresh quantity of times of first memory space is a relatively large, it indicates that the first memory space is accessed at a relatively high frequency. In this case, the first memory controller may wait for a longer period of time, to avoid a case in which the first memory space is in a refreshed state when the first memory space is unexpectedly accessed.

Implementation 4

If at least one of the N second indication signals indicates that a memory space controlled by a corresponding memory controller is idle, and the first memory space is idle, the first memory controller determines to synchronously refresh the first memory space and at least one second memory space respectively corresponding to the at least one second indication signal.

According to the foregoing solution, on the one hand, the under-refresh quantity of times of the first memory space can be reduced, to reduce a data loss risk; and on the other hand, because the first memory space is synchronously refreshed with the at least one second memory space that is idle, when the memory subsequently needs to be continuously accessed, if an access request is separately sent to a plurality of channels, according to the foregoing solution, the probability that any one of the plurality of memory spaces is in a refreshed state can be reduced, to reduce the probability that based on the access request separately sent to the plurality of channels, stream interruption occurs in the system because a memory space is in a refreshed state.

Implementation 5

If the under-refresh quantity of times of the first memory space is greater than or equal to a first threshold, the first memory controller determines to forcibly refresh the first memory space.

According to the foregoing solution, the under-refresh quantity of times of the first memory space can be reduced when the under-refresh quantity of times of the first memory space is relatively large, to reduce a data loss risk.

In a possible design, that the first memory controller outputs the first indication signal may be specifically implemented in the following manner: When the under-refresh quantity of times of the first memory space is greater than or equal to the first threshold, the first memory controller outputs a first indication signal used to indicate that the first memory space is being forcibly refreshed; or, when the under-refresh quantity of times of the first memory space is less than the first threshold, the first memory controller outputs a first indication signal used to indicate that the first memory space is not forcibly refreshed.

In a possible design, that the first memory controller outputs the first indication signal may be specifically implemented in the following manner: If the first memory space includes a plurality of subspaces, when any one of the plurality of subspaces is being forcibly refreshed, the first memory controller outputs a first indication signal used to indicate that the first memory space is being forcibly refreshed, or when none of the plurality of subspaces is forcibly refreshed, the first memory controller outputs a first indication signal used to indicate that the first memory space is not forcibly refreshed.

According to the foregoing solution, because the plurality of subspaces share a same group of address lines and a same group of command lines, the first memory controller can refresh only one subspace at a same moment. Therefore, when any one of the plurality of subspaces is forcibly refreshed, the first memory controller can send the first indication signal indicating that the first memory space is being forcibly refreshed to the N memory controllers other than the first memory controller in the refresh processing apparatus, so that the other memory controllers determine whether to synchronously refresh the subspace that is being forcibly refreshed in the first memory space.

In a possible design, that the first memory controller outputs the second indication signal may be specifically implemented in the following manner: If the first memory space includes a plurality of subspaces, when any one of the plurality of subspaces is idle, the first memory controller outputs a second indication signal used to indicate that the first memory space is idle, or when the plurality of subspaces are all in a data transmission state, the first memory controller outputs a second indication signal used to indicate that the first memory space is not idle.

According to the foregoing solution, because the plurality of subspaces share a same group of address lines and a same group of command lines, the first memory controller can refresh only one subspace at a same moment. When any one of the plurality of subspaces is idle, the first memory controller can send the second indication signal indicating that the first memory space is idle to the N memory controllers other than the first memory controller in the refresh processing apparatus, so that when determining that memory spaces corresponding to the other memory controllers are idle, the other memory controllers control the memory spaces to be synchronously refreshed with the subspace that is idle in the first memory space.

In a possible design, that the first memory controller determines the refresh policy of the first memory space may be specifically implemented in the following manner: The first memory controller determines the refresh policy of the first memory space based on the N first indication signals and the N second indication signals, and/or refresh indication information of each of the plurality of subspaces. The refresh policy of the first memory space is applied to at least one of the plurality of subspaces. The refresh indication information of each subspace includes at least one of the following: an under-refresh quantity of each subspace, input and output data traffic of each subspace, and whether each subspace is idle.

According to a second aspect, an embodiment of this application provides refresh processing method. The method includes the following steps: separately outputting, by a first memory controller in a plurality of memory controllers, a first indication signal and a second indication signal to N memory controllers other than the first memory controller in the plurality of memory controllers, where N is greater than or equal to 1; and determining, by the first memory controller, a refresh policy of the first memory space based on at least one of the following information: N first indication signals and N second indication signals that are respectively output by the N memory controllers, and refresh indication information of the first memory space.

The first indication signal is used to indicate whether the first memory space controlled by the first memory controller is to be forcibly refreshed, and the second indication signal is used to indicate whether the first memory space is idle. The plurality of memory controllers are in one-to-one correspondence with a plurality of memory spaces, and respectively control the memory spaces corresponding to the plurality of memory controllers, and any two of the plurality of memory controllers are communicatively connected. The first memory controller is any one of the plurality of memory controllers. The refresh indication information of the first memory space includes at least one of the following: an under-refresh quantity of times of the first memory space, used to indicate a quantity of times that the first memory space is not refreshed at a preset refresh time; input and output data traffic of the first memory space; and the second indication signal of the first memory controller.

In a possible design, the determining, by the first memory controller, a refresh policy of the first memory space includes: if any one of the N first indication signals indicates that a memory space controlled by a corresponding memory controller is being forcibly refreshed, determining, by the first memory controller, to refresh the first memory space.

In a possible design, the determining, by the first memory controller, a refresh policy of the first memory space includes: if any one of the N first indication signals indicates that a memory space controlled by a corresponding memory controller is being forcibly refreshed, determining, by the first memory controller when the refresh indication information of the first memory space meets a preset condition, to refresh the first memory space.

The preset condition includes at least one of the following: The under-refresh quantity of times is greater than or equal to a preset refresh threshold; the input and output data traffic of the first memory space is less than a preset traffic threshold; and the first memory space is idle.

In a possible design, the determining, by the first memory controller, a refresh policy of the first memory space includes: if the under-refresh quantity of times of the first memory space is greater than or equal to a first threshold, determining, by the first memory controller, to forcibly refresh the first memory space.

In a possible design, the determining, by the first memory controller, a refresh policy of the first memory space includes: if any one of the N first indication signals indicates that any memory space controlled by a corresponding memory controller is not forcibly refreshed, and the under-refresh quantity of times of the first memory space is greater than or equal to a second threshold and less than the first threshold, determining, by the first memory controller when the first memory space is idle, to refresh the first memory space.

In a possible design, the determining, by the first memory controller when the first memory space is idle, to refresh the first memory space includes: determining, by the first memory controller, idle waiting duration based on the under-refresh quantity of times of the first memory space; and when the first memory space is switched from a data transmission state to an idle state, determining, by the first memory controller, to refresh the first memory space after waiting for the idle waiting duration.

In a possible design, the determining, by the first memory controller, to refresh the first memory space includes: if at least one of the N second indication signals indicates that a memory space controlled by a corresponding memory controller is idle, and the first memory space is idle, determining, by the first memory controller, to synchronously refresh the first memory space and at least one second memory space respectively corresponding to the at least one second indication signal.

In a possible design, the outputting, by the first memory controller, the first indication signal includes: when the under-refresh quantity of times of the first memory space is greater than or equal to the first threshold, outputting, by the first memory controller, a first indication signal used to indicate that the first memory space is being forcibly refreshed; or when the under-refresh quantity of times of the first memory space is less than the first threshold, outputting, by the first memory controller, a first indication signal used to indicate that the first memory space is not forcibly refreshed.

In a possible design, the outputting, by the first memory controller, the first indication signal includes: if the first memory space includes a plurality of subspaces, when any one of the plurality of subspaces is being forcibly refreshed, outputting, by the first memory controller, a first indication signal used to indicate that the first memory space is being forcibly refreshed, or when none of the plurality of subspaces is forcibly refreshed, outputting, by the first memory controller, a first indication signal used to indicate that the first memory space is not forcibly refreshed.

In a possible design, the outputting, by the first memory controller, the second indication signal includes: if the first memory space includes a plurality of subspaces, when any one of the plurality of subspaces is idle, outputting, by the first memory controller, a second indication signal used to indicate that the first memory space is idle, or when the plurality of subspaces are all in a data transmission state, outputting, by the first memory controller, a second indication signal used to indicate that the first memory space is not idle.

In a possible design, the determining, by the first memory controller, a refresh policy of the first memory space includes: determining, by the first memory controller, the refresh policy of the first memory space based on the N first indication signals and the N second indication signals, and/or refresh indication information of each of the plurality of subspaces. The refresh policy of the first memory space is applied to at least one of the plurality of subspaces.

The refresh indication information of each subspace includes at least one of the following: an under-refresh quantity of times of each subspace, input and output data traffic of each subspace, and whether each subspace is idle.

According to a third aspect, this application provides a memory controller. The memory controller has a function of implementing the method example in the second aspect. The function may be implemented by hardware, or may be implemented by hardware by executing corresponding software. The hardware or the software includes one or more modules corresponding to the function.

In a possible design, a structure of the memory controller includes a transceiver unit and a processing unit. The units may execute corresponding functions in the method example. For details, refer to the detailed descriptions in the method example. Details are not described herein again.

According to a fourth aspect, an embodiment of this application further provides a memory controller. The memory controller includes a memory, a processor, and a communications module. The memory is configured to store a computer-readable program. The processor is configured to invoke an instruction stored in the memory, to perform a corresponding function in the method example. The communications module is configured to perform a data receiving function and/or a data sending function in the method example.

According to a fifth aspect, an embodiment of this application provides a refresh processing system. The refresh processing system includes the refresh processing apparatus and the plurality of memory spaces that are provided in the first aspect and any possible design of the first aspect.

According to a sixth aspect, an embodiment of this application provides a computer-readable storage medium. The computer-readable storage medium stores a computer instruction. When the instruction is run on a computer, the computer is enabled to perform the method in the second aspect and any possible design of the first aspect.

According to a seventh aspect, an embodiment of this application provides a computer program product. When the computer program product is invoked by a computer, the computer is enabled to perform the method in the second aspect and any possible design of the second aspect.

In addition, for technical effects brought by any possible design manner in the second to the seventh aspects, refer to technical effects brought by different design manners in the first aspect, and details are not described herein again.

DESCRIPTION OF EMBODIMENTS

To make the objectives, technical solutions, and advantages of embodiments of this application clearer, the following further describes the embodiments of this application in detail with reference to the accompanying drawings.

It should be noted that "a plurality of" means "at least two" in the embodiments of this application. In addition, it should be understood that in the description of this application, terms such as "first" and "second" are merely used for distinction description, and shall not be understood as an indication or implication of relative importance or an indication or implication of an order.

First, an application scenario of the embodiments of this application is briefly described.

Figure 1:
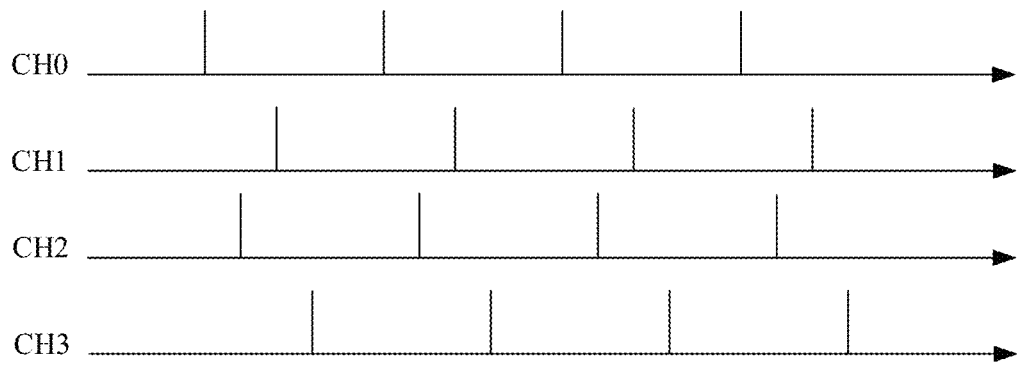
FIG. 1 is a schematic diagram of a time sequence of refreshing according to the prior art.
Figure 2:
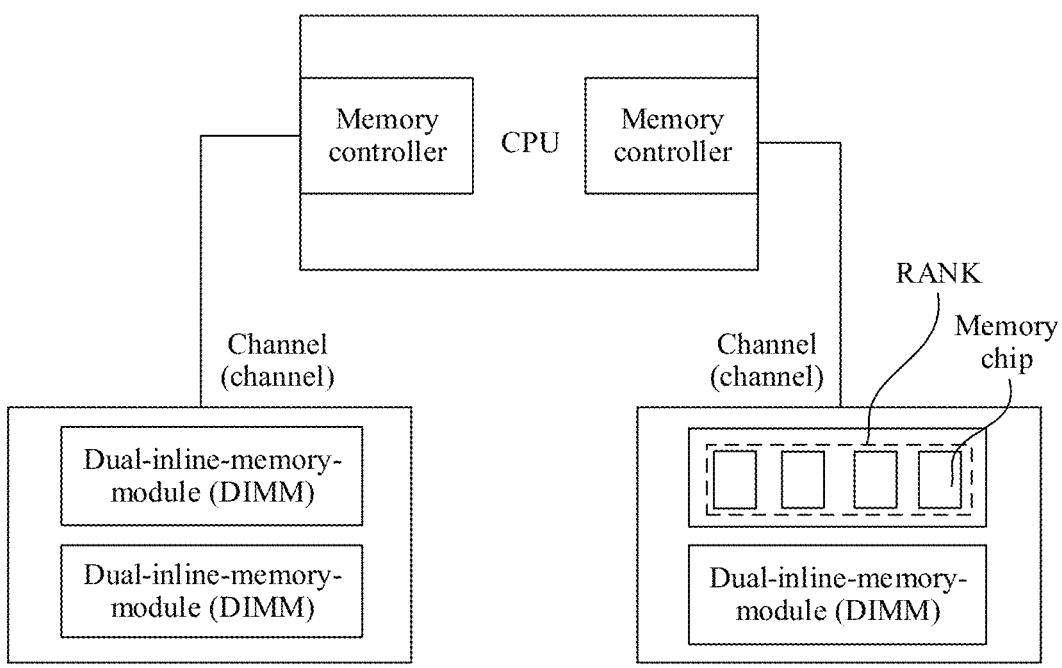
FIG. 2 is a schematic diagram of a structure of a computer system according to an embodiment of this application.

A refresh processing solution provided in the embodiments of this application may be applied to a computer system shown in FIG. 2.

The computer system shown in FIG. 2 includes a central processing unit (CPU) and a plurality of dual-inline-memory-modules (DIMM) that are communicatively connected to the CPU. The CPU includes two memory controllers, and each memory controller corresponds to one channel. One channel is connected to two DIMMs, each DIMM includes one RANK, and each RANK includes four memory chips. The following describes the memory controller, the channel, the DIMM, the RANK, and the chip one by one.

The memory controller in the computer system is configured to control data transmission between the CPU and a memory, and the memory controller may enable the memory to exchange data with the CPU. In the prior art, the memory controller includes a command processing module, a data processing module, and a refreshing module. The command processing module is configured to process an instruction sent by the CPU. The data processing module is configured to process data that is read or written by the CPU into a memory. The refreshing module is configured to refresh the memory according to a refresh command. In addition, in this embodiment of this application, the memory controller further includes a refresh processing module. A function of the module is described in the following embodiments, and details are not described herein.

It should be noted that, in this embodiment of this application, the memory controller may be integrated in the CPU, or may be a separate chip independent of the CPU. The memory controller is integrated in the CPU, so that a path from the CPU to the memory is shorter, and a delay of the memory is reduced.

The channel may be understood as a memory controller and a memory space corresponding to the memory controller. If the computer system includes a plurality of channels, these channels are generally completely the same and independent of each other. Generally, a dual-channel memory actually refers to that a CPU has two completely independent memory controllers. Generally, a data bit width of the memory controller is 32 bits or 64 bits.

The DIMM is commonly referred to as a DIMM memory module. A mainboard of the computer system is provided with DIMM slots, one DIMM memory module may be inserted into each DIMM slot, and one channel may correspond to one or a plurality of DIMM slots. The DIMM is implemented by attaching a plurality of same memory chips to a lining board of a same printed circuit board (PCB).

The RANK refers to a group of memory chips, and the group of memory chips are in parallel, so that a data bit width meets a bit width requirement of the memory controller. The RANK is also referred to as a physical BANK (P-BANK). As described above, a data bit width of the memory controller is generally 32 bits or 64 bits, and a bit width of a single memory chip may be 4 bits, 8 bits, or 16 bits. Therefore, a plurality of memory chips need to be connected in parallel to form a bit width of 32 bits or 64 bits, to meet the bit width requirement of the memory controller. For example, if the data bit width of the memory controller is 64 bits, and the bit width of the memory chip is 8 bits, eight memory chips form one RANK. Similarly, if the data bit width of the memory controller is 64 bits, and the bit width of the memory chip is 16 bits, four memory chips form one RANK. Generally, one DIMM may include 1 to 4 RANKs.

Figure 3:
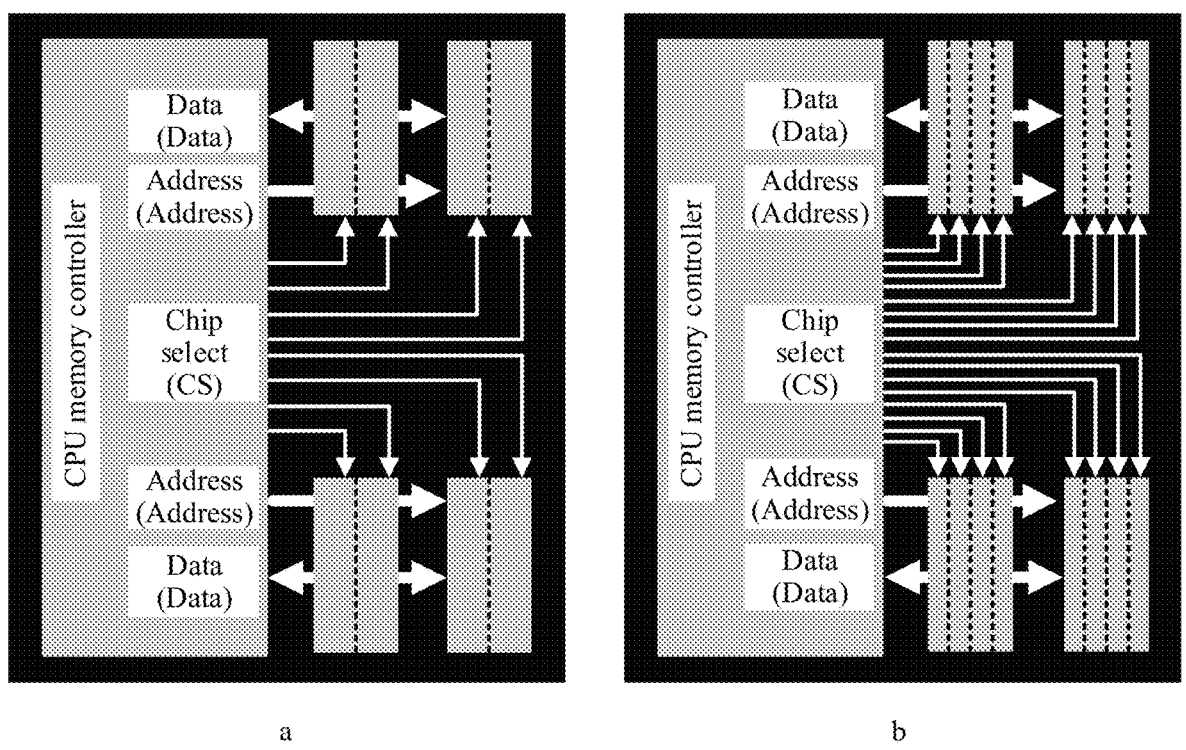
FIG. 3 is a schematic diagram of outputting, by a memory controller, a chip select signal to different RANKs according to an embodiment of this application.

In actual implementation, different RANKs are connected to different chip select (CS) signal output pins on the memory controller, to be specific, the memory controller enables different RANKs by using different CS signals, as shown in FIG. 3. In FIG. 3, a figure a indicates that one memory controller corresponds to four DIMMs, and each DIMM includes two RANKs. In this case, the memory controller outputs eight CS signals, and each CS signal is used to enable one RANK. In FIG. 3, a figure b indicates that one memory controller corresponds to four DIMMs, and each DIMM includes four RANKs. In this case, the memory controller outputs 16 CS signals, and each CS signal is used to enable one RANK.

It should be noted that, when a memory space corresponding to one memory controller includes a plurality of RANKs, the plurality of RANKs share a same group of command lines and a same group of address lines, and each RANK is independently refreshed. To be specific, in a same time period, the memory controller enables only one CS signal in a plurality of CS signals, to refresh a RANK enabled by the CS signal.

The memory chip is a basic unit of a DIMM. A bit width of a single memory chip may be 4 bits, 8 bits, or 16 bits, and a plurality of memory chips are in parallel to form a bit width of 32 bits or 64 bits, to meet the bit width requirement of the memory controller.

It should be noted that, in an example in which the CPU of the computer system shown in FIG. 2 supports a two channels, during actual implementation, the refresh processing solution provided in the embodiments of this application may be applied to a computer system that supports a plurality of channels, to be specific, a quantity of channels supported by the computer system is not specifically limited in the refresh processing solution provided in the embodiments of this application, provided that the quantity of channels is greater than 1. Likewise, in an example in which in the computer system shown in FIG. 2, one channel corresponds to two DIMMs, one DIMM includes one RANK, and one RANK includes four memory chips, during actual implementation, in a computer system to which the refresh processing solution provided in the embodiments of this application is applied, a quantity of DIMMs corresponding to each channel, a quantity of RANKs included in each DIMM, and a quantity of memory chips included in each RANK are not limited.

As described above, the refreshing module included in the memory controller may refresh the memory. When a memory space corresponding to a memory controller includes one RANK (in other words, one channel corresponds to one RANK), each channel in the computer system is independently refreshed; or when a memory space corresponding to a memory controller includes a plurality of RANKs, each RANK is independently refreshed. In an example in which a memory space corresponding to a memory controller includes one RANK, a time sequence of refreshing each channel may be shown in FIG. 4.

Figure 4:
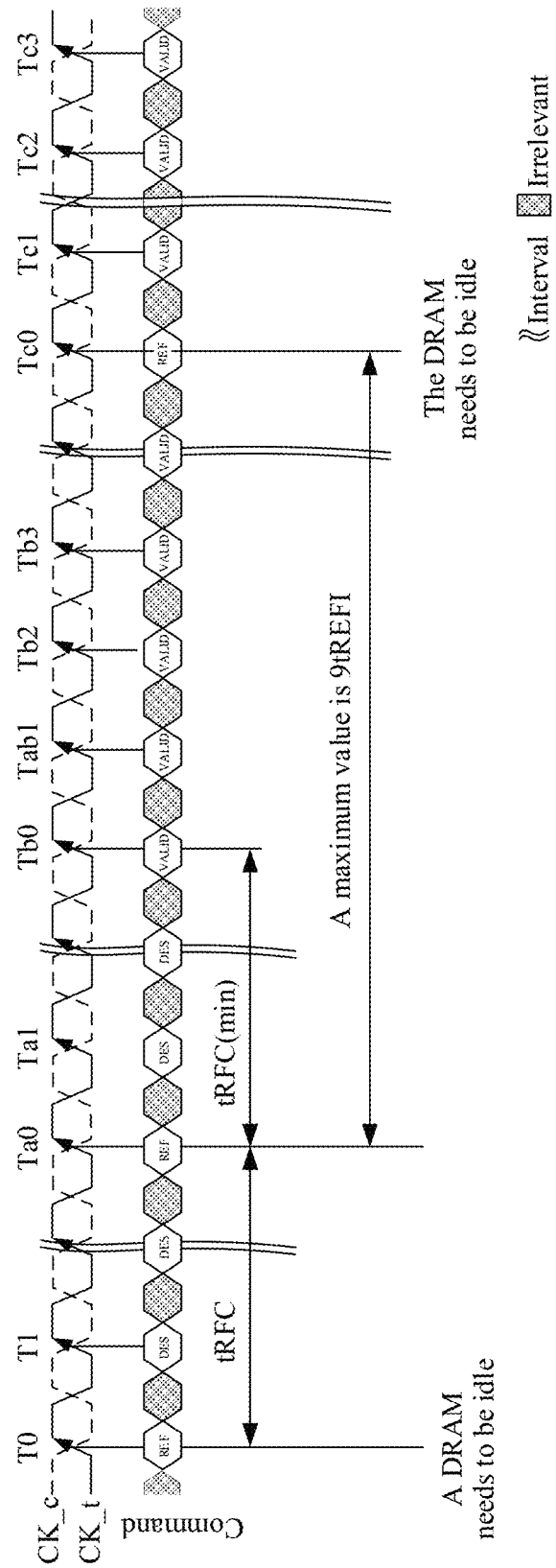
FIG. 4 is a schematic diagram of a time sequence of refreshing according to an embodiment of this application.

In FIG. 4, when refreshing starts, a memory space corresponding to the channel needs to be idle, in other words, no data is transmitted in the memory space corresponding to the channel. tRFC represents duration of one refreshing, to be specific, after a refresh command is generated, in this time period of tRFC, the memory controller refreshes the memory space corresponding to the channel. In this case, the memory space corresponding to the channel needs to be idle.

tREFI represents an average interval of refresh operations. In other words, for two adjacent refresh operations, an interval between the two refresh operations (namely, a difference between a time for starting a second refresh operation and a time for starting a first refresh operation) may be less than tREFI or greater than tFEFI. Provided that the average interval of the refresh operations is tFEFI after a plurality of times of refreshing. Specifically, as shown in FIG. 4, after one refresh operation ends, a next refresh operation may be immediately started (in other words, an interval of the refresh operations is tRFC). After one refresh operation starts, the next refresh operation may be performed after an interval of 9tREFI.

As mentioned in the background, the DRAM stores data by using charges in a capacitor. However, the charges constantly leak away due to electric leakage. Therefore, refreshing is performed before the charges are lost, to avoid a data loss. If an interval of refresh operations is excessively long, data is lost. Therefore, a protocol stipulates that a maximum interval of refresh operations is 9tREFI.

To ensure that the average interval of the refresh operations is tREFI, a simplest implementation is as follows: One refresh operation is performed at a moment T0, then, a next refresh operation is performed at a moment T0+tREFI after an interval of tREFI, then, a next refresh operation is performed at a moment T0+2tREFI after an interval of tREFI, . . . , and so on. In other words, refresh operations are periodically performed, and a period of performing the refresh operations is tREFI. However, in a specific implementation process, if data is being transmitted in a memory space corresponding to a channel within a time period tRFC that is used to perform a refresh operation within a specific period, according to the foregoing mechanism, data transmission needs to be stopped in the memory space and resumed after refreshing is completed, and the memory space is switched to an idle state. This method certainly reduces memory access efficiency.

Therefore, to make a refresh mechanism more flexible and improve the memory access efficiency, a postponing mechanism and a pulling-in mechanism for refreshing are introduced in the prior art. As the name implies, the postponing mechanism means delaying a refresh time. For example, in the foregoing example, if data is being transmitted on a channel, refreshing may not need to be performed; instead, refreshing is performed after the data is transmitted, to avoid an impact of a refresh operation on the memory access efficiency. Similarly, the pulling-in mechanism means performing refreshing in advance. For example, when a channel is idle, refreshing may be performed in advance even if a time period after last refreshing is less than tFEFI.

Figure 5:
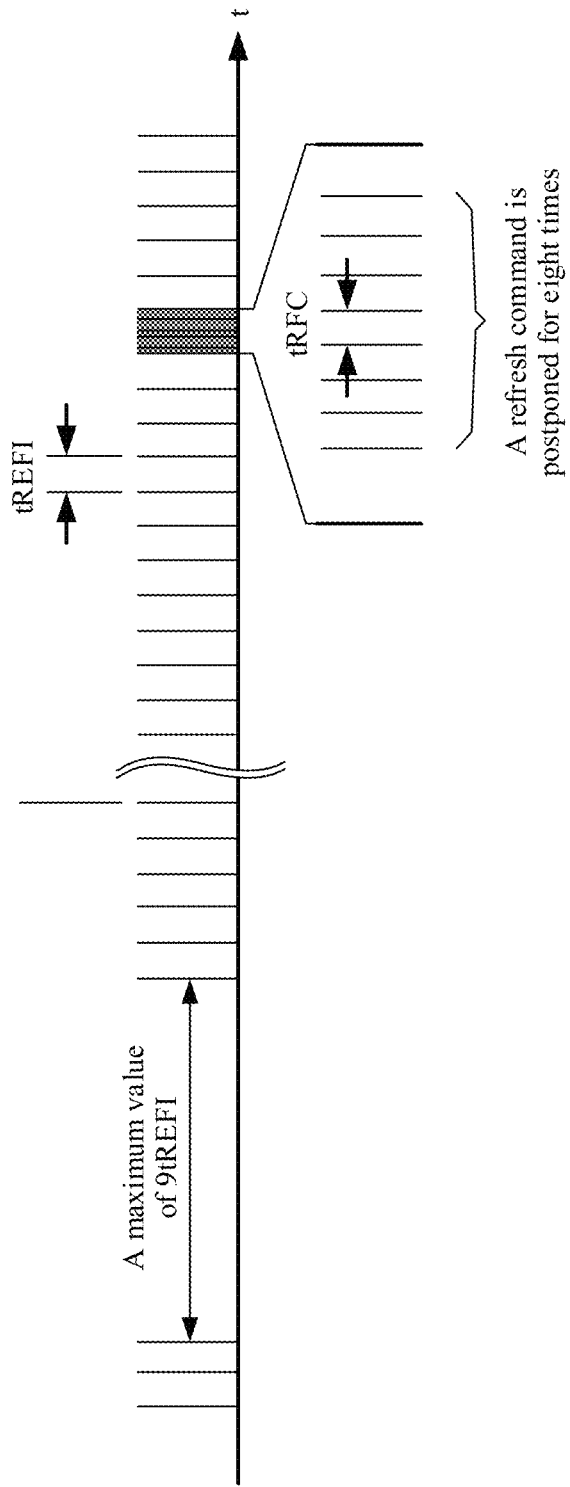
FIG. 5 is a schematic diagram of a time sequence of postponed refreshing according to an embodiment of this application.

The following provides a brief description by using an example of the postponing mechanism. FIG. 5 is a schematic diagram of a time sequence of the postponing mechanism. In FIG. 5, an interval of refresh operations is 9tREFI. In the refresh mechanism, an average interval of tREFI of the refresh operations needs to be ensured. Therefore, when the interval is 9tREFI, it is considered that the channel is under-refreshed, and an under-refresh quantity of times of the channel is 8. Then, in a subsequent process of performing refresh operations, the refresh operations may be continuously performed for eight times, so that an average interval of the refresh operations is tREFI.

Certainly, the postponing mechanism shown in FIG. 5 is an extreme case. During actual implementation, the interval of the refresh operations may be any interval between tRFC and 9tREFI. When an under-refresh quantity of times caused by previous postponing is subsequently compensated for, refreshing may be continuously performed for a plurality of times, or the under-refresh quantity of times may be compensated for in a plurality of times.

Although the postponing mechanism and the pulling-in mechanism can reduce the impact of the refresh operations in the channel on the memory access efficiency to some extent, it is difficult to implement integration of a plurality of channels because the postponing mechanism and the pulling-in mechanism are used only for the operations in this channel. Especially if memory addresses are continuously accessed, for example, in the field of artificial intelligence (AI), memory access within a short time is interleaved to all channels. By using the postponing mechanism and the pulling-in mechanism, it is difficult to meet a memory access requirement of a plurality of channels. If any channel in a system is in a refreshed state, transient stream interruption may occur in memory address access. Therefore, according to the refresh processing solution in the prior art, because a plurality of channels are independently refreshed, there is a relatively high probability of stream interruption in the system, affecting memory access efficiency.

Therefore, the embodiments of this application provide a refresh processing method, apparatus, and system, and a memory controller, to improve memory access efficiency. The method and the apparatus are based on a same inventive concept. Because principles of the method and the apparatus for resolving a problem are similar, mutual reference may be made between implementations of the apparatus and the method, and no repeated description is provided.

The following describes in detail a refresh processing solution provided in the embodiments of this application with reference to accompanying drawings.

Figure 6:
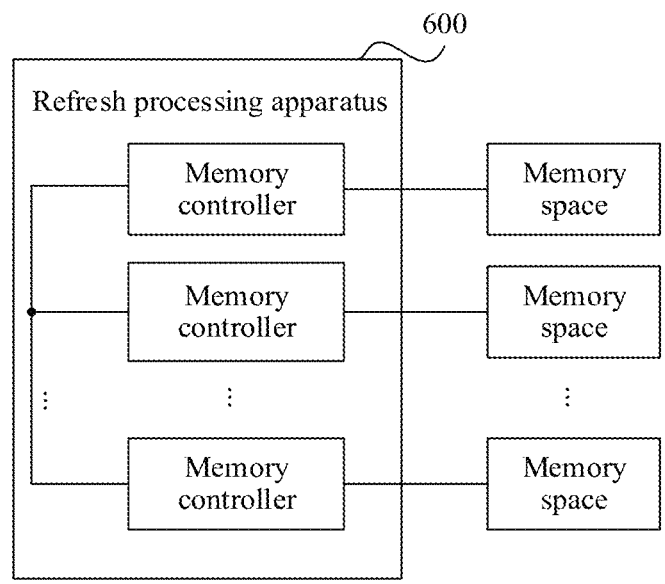
FIG. 6 is a schematic diagram of a structure of a refresh processing apparatus according to an embodiment of this application.

FIG. 6 is a schematic diagram of a structure of a refresh processing apparatus according to an embodiment of this application. The refresh processing apparatus 600 includes a plurality of memory controllers. The plurality of memory controllers are in one-to-one correspondence with a plurality of memory spaces, and respectively control the memory spaces corresponding to the plurality of memory controllers, any two of the plurality of memory controllers are communicatively connected.

A first memory controller in the plurality of memory controllers is configured to: separately output a first indication signal and a second indication signal to N memory controllers other than the first memory controller in the plurality of memory controllers, where N is greater than or equal to 1; and determine a refresh policy of a first memory space based on at least one of the following information: N first indication signals and N second indication signals that are respectively output by the N memory controllers, and refresh indication information of the first memory space.

The first indication signal is used to indicate whether the first memory space controlled by the first memory controller is to be forcibly refreshed, and the second indication signal is used to indicate whether the first memory space is idle. The refresh indication information of the first memory space includes at least one of the following: an under-refresh quantity of times of the first memory space, used to indicate a quantity of times that the first memory space is not refreshed at a preset refresh time; input and output data traffic of the first memory space; and the second indication signal of the first memory controller.

In this embodiment of this application, each memory controller in the refresh processing apparatus 600 outputs a first indication signal and a second indication signal to other memory controllers. For example, after being powered on for the first time, the first memory controller may periodically output a first indication signal to the other N memory controllers at an interval of T1. Specifically, when the first memory space does not need to be forcibly refreshed, the first memory controller periodically outputs a low level at the interval of T1. When the first memory controller determines that the first memory space is to be forcibly refreshed (for example, when the first memory controller determines that the under-refresh quantity of times of the first memory space is 8), the first memory controller outputs a high level in the signal period T1 corresponding to this moment, where duration of the high level is T1. After detecting the high level whose duration is T1 in the first indication signal, the other memory controllers may learn that the first memory space is to be forcibly refreshed. Certainly, during actual implementation, the high level of the first indication signal may be used to indicate that the first memory space does not need to be forcibly refreshed, and the low level of the first indication signal may be used to indicate that the first memory space is to be forcibly refreshed. This is not specifically limited in this embodiment of this application.

Similarly, after being powered on for the first time, the first memory controller may periodically output the second indication signal to the other N memory controllers at an interval of T2. T2 may be equal to T1 in the foregoing example. Specifically, when the first memory space is in a data transmission state, the first memory controller periodically outputs a low level at the interval of T2. When the first memory space switches from the data transmission state to an idle state (in other words, when a current data transmission process ends), the first memory controller starts to periodically output a high level at the interval of T2, until the first memory space switches to a data transmission state again. When detecting that the second indication signal is at a low level, the other memory controllers may learn that the first memory space is in a data transmission state. When detecting that the second indication signal is at a high level, the other memory controllers may learn that the first memory space is idle. Certainly, during actual implementation, the high level of the second indication signal may be used to indicate that the first memory space is in a data transmission state, and the low level of the second indication signal may be used to indicate that the first memory space is idle. This is not specifically limited in this embodiment of this application.

In addition, when outputting the first indication signal, the first memory controller may not use a periodic output manner. For example, when the first memory space does not need to be forcibly refreshed, the first memory controller does not output the first indication signal. When the first memory controller determines that the first memory space is to be forcibly refreshed, the first memory controller outputs a pulse signal (namely, the first indication signal) to the other memory controllers, triggering the other memory controllers, when receiving the pulse signal, to learn that the first memory space is to be forcibly refreshed.

It should be noted that in FIG. 6, only one connection cable is used to indicate that any two memory controllers are communicatively connected. During actual implementation, the communication connection between two memory controllers is not limited to the form shown in FIG. 6. For example, two memory controllers may be communicatively connected by using two data cables, four data cables, or the like, to separately output, to each other, a first indication signal and a second indication signal of a memory space that are controlled by the memory controllers. In FIG. 6, only one connection cable between two memory controllers is used to indicate the communication connection, to simplify drawing.

The following describes in detail some concepts used in the refresh processing apparatus 600.

1. First Memory Controller

In the refresh processing apparatus 600, the first memory controller may be any one of the plurality of memory controllers. Because any two of the plurality of memory controllers included in the refresh processing apparatus 600 are communicatively connected, each memory controller can output a first indication signal and a second indication signal to the N memory controllers other than the first memory controller in the refresh processing apparatus 600, and can also receive first indication signals and second indication signals that are output by the other memory controllers. For any first memory controller, the output first indication signal and second indication signal may be used by another memory controller to determine a refresh policy. The received N first indication signals and N second indication signals may be used to determine a refresh policy of the first memory space.

In addition, in this embodiment of this application, the first memory controller receives N first indication signals and N second indication signals. Because each memory controller in the refresh processing apparatus outputs one first indication signal and one second indication signal, that the first memory controller receives N first indication signals and N second indication signals implicitly means that the refresh processing apparatus 600 includes N+1 memory controllers.

2. First Memory Space

In the refresh processing apparatus 600, one memory controller and a memory space corresponding to the memory controller may be considered as a channel. For the first memory controller, the first memory space corresponding to the first memory controller may include one or more DIMMs. Each DIMM may include one or more RANKs. This is not specifically limited in this embodiment of this application.

In addition, in this embodiment of this application, the first memory space may be implemented in a form of a memory such as a DRAM, a synchronous dynamic random access memory (SDRAM), or a high-bandwidth memory (HBM).

3. Under-Refresh Quantity of Times of the First Memory Space

The under-refresh quantity of times of the first memory space is used to indicate a quantity of times that the first memory space is not refreshed at a preset refresh time. As shown by the time sequence of refreshing in FIG. 4, an average interval of refresh operations is tREFI. When the interval between a current refresh operation and a last refresh operation is equal to tREFI, if data is being transmitted in a memory space, the memory space may not be refreshed at this time. In a refresh mechanism, an average interval of tREFI of the refresh operations needs to be ensured. Therefore, in this case, the memory space is referred to as an under-refreshed memory space. Specifically, a longer interval between the current refresh operation and the last refresh operation indicates a larger under-refresh quantity of times of the memory space.

For example, assuming that one refresh operation is completed in a memory space at a moment T0, within a time period from T0 to T0+2tREFI, because data is always transmitted in the memory space, the memory space is not refreshed at a moment T0+2tREFI, and in this case, the under-refresh quantity of times of the memory space is 2. Assuming that one refresh operation is completed in a memory space at a moment T0, within a time period from T0 to T0+5tREFI, because data is always transmitted in the memory space, the memory space is not refreshed at a moment T0+5tREFI, and in this case, the under-refresh quantity of times of the memory space is 5.

4. First Indication Signal and Second Indication Signal

The first indication signal is used to indicate whether the first memory space controlled by the first memory controller is to be forcibly refreshed, and the second indication signal is used to indicate whether the first memory space is idle.

Specifically, a condition for forcibly refreshing the first memory space may be as follows: The under-refresh quantity of times of the first memory space is greater than or equal to a first threshold. To be specific, when the under-refresh quantity of times of the first memory space is greater than or equal to the first threshold, the first memory controller determines to forcibly refresh the first memory space, and outputs a first indication signal used to indicate that the first memory space is being forcibly refreshed; or, when the under-refresh quantity of times of the first memory space is less than the first threshold, the first memory controller outputs a first indication signal used to indicate that the first memory space is not forcibly refreshed.

As mentioned above, because the DRAM stores data by using charges in a capacitor, if an interval of refresh operations is excessively long, the charges constantly leak away due to electric leakage, thereby causing a data loss. Therefore, a memory needs to be refreshed before the charges are lost, in other words, it is stipulated that a maximum interval of refresh operations is 9tREFI. When the interval of the refresh operations is excessively long (in other words, the under-refresh quantity of times is relatively large, for example, 7 or 8), a data loss risk is increased. Therefore, when the under-refresh quantity of times of the first memory space is greater than or equal to the first threshold, the first memory space may be forcibly refreshed, to avoid a data loss.

For example, the first threshold may be 7 or 8.

In addition, each memory controller in the refresh processing apparatus 600 may determine, based on data transmission in a memory space controlled by the corresponding memory controller, whether the memory space is idle. Therefore, when the first memory space is idle, the first memory controller may output a second indication signal that is used to indicate that the first memory space is idle; or when the first memory space is in a data transmission state, the first memory controller outputs a second indication signal that is used to indicate that the first memory space is not idle.

It can be easily learned from the foregoing description that, in the refresh processing apparatus 600 provided in this embodiment of this application, the first memory controller no longer independently controls refreshing of the first memory space, but determines the refresh policy of the first memory space by comprehensively considering information about whether a plurality of channels are being forcibly refreshed and whether the plurality of channels are idle indicated in first indication signals and second indication signals of the memory spaces of other channels, and the refresh indication information of the first memory space. According to this solution, a plurality of memory spaces can be considered, to improve memory access efficiency and system performance.

The following specifically describes how the first memory controller determines the refresh policy of the first memory space based on the N first indication signals, the N second indication signals, and the at least one type of information in the refresh indication information of the first memory space.

Implementation 1

If any one of the N first indication signals indicates that a memory space controlled by a corresponding memory controller is being forcibly refreshed, the first memory controller determines to refresh the first memory space.

In the implementation 1, when determining, based on the N first indication signals, that any memory space is being forcibly refreshed, the first memory controller controls the first memory space to be synchronously refreshed with the memory space that is being forcibly refreshed.

According to the foregoing solution, on the one hand, the under-refresh quantity of times of the first memory space can be reduced, to reduce a data loss risk; and on the other hand, because the first memory space is synchronously refreshed with the memory space that is being forcibly refreshed, when the memory needs to be continuously accessed, an access request is separately sent to a plurality of channels. According to the foregoing solution, a probability that any one of the plurality of memory spaces is in a refreshed state can be reduced, to reduce a probability that based on the access request separately sent to the plurality of channels, stream interruption occurs in the system because a memory space is in a refreshed state.

Implementation 2

If any one of the N first indication signals indicates that a memory space controlled by a corresponding memory controller is being forcibly refreshed, the first memory controller determines, when the refresh indication information of the first memory space meets a preset condition, to refresh the first memory space.

The preset condition includes at least one of the following: The under-refresh quantity of times is greater than or equal to a preset refresh threshold (for example, the preset refresh threshold may be 6); the input and output data traffic of the first memory space is less than a preset traffic threshold; and the first memory space is idle.

The preset refresh threshold may be preset based on different requirements and scenarios. For example, the preset refresh threshold may be 5, 6, or 7.

In the implementation 2, when determining, based on the N first indication signals, that any memory space is being forcibly refreshed, the first memory controller may control, when the refresh indication information of the first memory space meets the preset condition, the first memory space to be synchronously refreshed with the memory space that is being forcibly refreshed. When the refresh indication information of the first memory space does not meet the preset condition, the first memory space is not refreshed.

A difference between the implementation 2 and the implementation 1 lies in that, in the implementation 1, if another memory space is forcibly refreshed, the first memory controller unconditionally controls the first memory space to be refreshed, while in the implementation 2, the first memory controller conditionally controls the first memory space to be refreshed.

In the implementation 2, the preset condition is set mainly for the following reasons: 1. If the under-refresh quantity of times of the first memory space is relatively small (smaller than the preset refresh threshold), the first memory space does not need to be refreshed. 2. If the input and output data traffic of the first memory space is relatively large, the first memory space is preferentially used for data transmission, and may not need to be refreshed. 3. If the first memory space is idle, the first memory space may be refreshed; and if the first memory space is in a data transmission state, the first memory space is preferentially used for data transmission, and may not need to be refreshed.

According to the foregoing solution, if another memory space is being forcibly refreshed, the first memory controller conditionally controls the first memory space to be refreshed, which not only can allow data transmission of the first memory space when the preset condition is not met, but also can reduce the under-refresh quantity of times of the first memory space when the preset condition is met. Therefore, a data loss risk is reduced. Meanwhile, if the first memory space is refreshed when the preset condition is met, because the first memory space is synchronously refreshed with the memory space that is being forcibly refreshed, when the memory subsequently needs to be continuously accessed, an access request is separately sent to a plurality of channels. According to the foregoing solution, the probability that any one of the plurality of memory spaces is in a refreshed state can be reduced, to reduce the probability that based on the access request separately sent to the plurality of channels, stream interruption occurs in the system because a memory space is in a refreshed state.

Implementation 3

If any one of the N first indication signals indicates that any memory space controlled by a corresponding memory controller is not forcibly refreshed, and the under-refresh quantity of times of the first memory space is greater than or equal to a second threshold and less than the first threshold, the first memory controller determines, when the first memory space is idle, to refresh the first memory space.

If the under-refresh quantity of times of the first memory space is greater than or equal to the second threshold, and is less than the first threshold, it may be considered that the under-refresh quantity of times of the first memory space is at a medium level. In this case, if no other memory space is forcibly refreshed, the first memory controller may control the first memory space to be refreshed in an idle state. In other words, if the first memory space is in a data transmission state at this time, the first memory space does not need to be refreshed. If the first memory space is idle at this time, the first memory space may be refreshed.

For example, the first threshold may be 6 or 7, and the second threshold may be 2 or 3. Certainly, the first threshold and the second threshold may be configured based on different requirements and scenarios. Values of the first threshold and the second threshold are not specifically limited in this embodiment of this application.

In addition, if any one of the N first indication signals indicates that any memory space controlled by a corresponding memory controller is not forcibly refreshed, if the under-refresh quantity of times of the first memory space is less than the second threshold, the first memory controller may determine not to refresh the first memory space; and if the under-refresh quantity of times of the first memory space is greater than or equal to the first threshold, the first memory controller may determine to forcibly refresh the first memory space (which may be considered as an example of the following implementation 5).

According to the foregoing solution, if none of other memory spaces is forcibly refreshed, and the under-refresh quantity of times of the first memory space is at a medium level, there is no urgent need to forcibly refresh all the plurality of memory spaces. Therefore, the first memory space may be independently refreshed based on whether the first memory space is idle: If the first memory space is idle, the first memory space may be refreshed; or if the first memory space is in a data transmission state, the first memory space may not be refreshed, and in this case, the under-refresh quantity of times of the first memory space continues to increase. Because the under-refresh quantity of times of the first memory space is at a medium level, an increase in the under-refresh quantity of times does not directly cause an excessively long interval of refreshing, in other words, does not cause a data loss.

It should be noted that, during specific implementation, to avoid unexpected memory access, the first memory space is usually not refreshed when the first memory space is just switched from a data transmission state to an idle state, but the first memory controller waits for a period of time. If the first memory space is always idle within a waiting time, the first memory space may be refreshed after the waiting time ends.

In other words, that the first memory controller determines, when the first memory space is idle, to refresh the first memory space may be specifically implemented in the following manner: The first memory controller determines idle waiting duration based on the under-refresh quantity of times of the first memory space; and when the first memory space is switched from a data transmission state to an idle state, the first memory controller determines to refresh the first memory space after waiting for the idle waiting duration.

Usually, when the first memory controller determines the idle waiting duration, a larger under-refresh quantity of times of the first memory space indicates longer determined idle waiting duration. This is because if the under-refresh quantity of times of first memory space is a relatively large, it indicates that the first memory space is accessed at a relatively high frequency. In this case, the first memory controller may wait for a longer period of time, to avoid a case in which the first memory space is in a refreshed state when the first memory space is unexpectedly accessed.

For example, when the under-refresh quantity of times of the first memory space is 3, the idle waiting duration is 100 ns. When the under-refresh quantity of times of the first memory space is 4, the idle waiting duration is 200 ns.

In actual implementation, the idle waiting duration may be configured differently based on different requirements. For example, the idle waiting duration may be configured to be a fixed value, or different idle waiting duration may be configured when the under-refresh quantity of times of the first memory space is different, or the idle waiting duration may be configured to be a random value. This is not specifically limited in this embodiment of this application.

Implementation 4

If at least one of the N second indication signals indicates that a memory space controlled by a corresponding memory controller is idle, and the first memory space is idle, the first memory controller determines to synchronously refresh the first memory space and at least one second memory space respectively corresponding to the at least one second indication signal.

In the implementation 4, if the at least one second memory space is idle, the first memory controller may control the first memory space that is idle to be synchronously refreshed with the at least one second memory space that is idle.

In addition, in the implementation 4, if the first memory space is idle, the first memory controller may further determine, based on the under-refresh quantity of times of the first memory space, whether the first memory space is synchronously refreshed with the at least one second memory space that is idle. For example, when the under-refresh quantity of times of the first memory space is less than the second threshold, the first memory controller determines that the first memory space is synchronously refreshed with the at least one second memory space that is idle. For example, the second threshold may be 2 or 3.

In this example, if the under-refresh quantity of times of the first memory space is less than second threshold, it indicates that the under-refresh quantity of times of the first memory space is relatively small, and it may also indicate, at a specific level, that the first memory space is accessed at a relatively low frequency. In this case, the first memory space may be synchronously refreshed with the at least one second memory space that is idle. If the under-refresh quantity of times of the first memory space is greater than or equal to the second threshold, it indicates that the under-refresh quantity of times of the first memory space is relatively large, and it may also indicate, at a specific level, that the first memory space is accessed at a relatively high frequency. In this case, the first memory space may not be refreshed, to avoid a case in which the first memory space is in a refreshed state when the first memory space is unexpectedly accessed.

In the implementation 4, if the plurality of memory spaces corresponding to the plurality of memory controllers included in the refresh processing apparatus 600 are all idle, the plurality of memory spaces may be synchronously refreshed.

According to the foregoing solution, on the one hand, the under-refresh quantity of times of the first memory space can be reduced, to reduce a data loss risk; and on the other hand, because the first memory space is synchronously refreshed with the at least one second memory space that is idle, when the memory subsequently needs to be continuously accessed, if an access request is separately sent to a plurality of channels, according to the foregoing solution, the probability that any one of the plurality of memory spaces is in a refreshed state can be reduced, to reduce the probability that based on the access request separately sent to the plurality of channels, stream interruption occurs in the system because a memory space is in a refreshed state.

It should be noted that the implementation 4 and the implementation 1 may be implemented at the same time when the first memory controller determines the refresh policy of the first memory space. For example, the first memory controller determines, based on the N first indication signals, that a memory space 1 and a memory space 5 in the plurality of memory spaces are being forcibly refreshed. The first memory controller determines, based on the N second indication signals, that a memory space 4 in the plurality of memory space is idle, and determines that the first memory space is idle. In this case, the refresh policy of the first memory space determined by the first memory controller may be as follows: The first memory space is synchronously refreshed with the memory space 1, the memory space 4, and the memory space 5.

Similarly, the implementation 4 and the implementation 2 may also be implemented at the same time when the first memory controller determines the refresh policy of the first memory space. Details are not described herein again.

Implementation 5

If the under-refresh quantity of times of the first memory space is greater than or equal to the first threshold, the first memory controller determines to forcibly refresh the first memory space, and outputs a first indication signal used to indicate that the first memory space is being forcibly refreshed.

For example, the first threshold may be 7 or 8. Certainly, the first threshold may be configured based on different requirements and scenarios. The value of the first threshold is not specifically limited in this embodiment of this application.

As mentioned above, the first memory space may include one or more RANKs. When the first memory space includes a plurality of RANKs, the plurality of RANKs share a same group of command lines and a same group of address lines, and each RANK is independently refreshed. In addition, in this embodiment of this application, each RANK independently maintains one first indication signal and one second indication signal. Then, in this case, it is necessary to consider: 1. how the first indication signal and the second indication signal that are output by the first memory controller are both used for a plurality of RANKs; and 2. how the first memory controller determines the refresh policy of the first memory space and applies the refresh policy to a plurality of RANKs that are correspondingly controlled by the first memory controller.

For the foregoing two problems, this embodiment of this application provides the following solution:

That the first memory controller outputs the first indication signal may be specifically implemented in the following manner: If the first memory space includes a plurality of subspaces, when any one of the plurality of subspaces is being forcibly refreshed, the first memory controller outputs a first indication signal used to indicate that the first memory space is being forcibly refreshed, or when none of the plurality of subspaces is forcibly refreshed, the first memory controller outputs a first indication signal used to indicate that the first memory space is not forcibly refreshed.

That the first memory controller outputs the second indication signal may be specifically implemented in the following manner: If the first memory space includes a plurality of subspaces, when any one of the plurality of subspaces is idle, the first memory controller outputs a second indication signal used to indicate that the first memory space is idle, or when the plurality of subspaces are all in a data transmission state, the first memory controller outputs a second indication signal used to indicate that the first memory space is not idle.

In other words, for the first memory controller, if any one of the plurality of subspaces included in the first memory space is being forcibly refreshed, it may be considered that the first memory space is being forcibly refreshed; and if any one of the plurality of subspace included in the first memory space is idle, it may be considered that the first memory space is idle.

It should be noted that the subspace may be understood as the foregoing RANK, or may be understood as another concept. For example, an HBM is a high-bandwidth DRAM, and is widely used in a scenario that has a relatively high requirement for memory bandwidth. A channel of the HBM further includes a plurality of pseudo channels (PS-CH). One channel is further divided into a plurality of virtual sub-channels. The plurality of virtual sub-channels share a same group of address lines and a same group of command lines, and are used for data transmission in different memory spaces. Herein, a memory space corresponding to the PS-CH may also be understood as the foregoing subspace.

According to the foregoing solution, because the plurality of subspaces share a same group of address lines and a same group of command lines, the first memory controller can refresh only one subspace at a same moment. Therefore, when any one of the plurality of subspaces is forcibly refreshed, the first memory controller can send the first indication signal indicating that the first memory space is being forcibly refreshed to the N memory controllers other than the first memory controller in the refresh processing apparatus 600, so that the other memory controllers determine whether to synchronously refresh the subspace that is being forcibly refreshed in the first memory space. Similarly, when any one of the plurality of subspaces is idle, the first memory controller can send the second indication signal indicating that the first memory space is idle to the N memory controllers other than the first memory controller in the refresh processing apparatus 600, so that when determining that memory spaces corresponding to the other memory controllers are idle, the other memory controllers control the memory spaces to be synchronously refreshed with the subspace that is idle in the first memory space.

In addition, if the first memory space includes a plurality of subspaces, that the first memory controller determines the refresh policy of the first memory space may be specifically implemented in the following manner: The first memory controller determines the refresh policy of the first memory space based on refresh indication information of each of the plurality of subspaces. The refresh policy of the first memory space is applied to at least one of the plurality of subspaces. The refresh indication information of each subspace includes at least one of the following: an under-refresh quantity of each subspace, input and output data traffic of each subspace, and whether each subspace is idle.

Specifically, to determine a subspace in the plurality of subspaces, to which the refresh policy of the first memory space is applied to, may be implemented in different manners.

For example, one of the plurality of subspaces is randomly selected to execute the refresh policy of the first memory space. For example, when it is determined that the first memory space needs to be refreshed, a subspace with a relatively large under-refresh quantity of times is refreshed. For another example, when it is determined that the first memory space needs to be refreshed, a subspace with relatively small input and output data traffic is refreshed. For another example, when it is determined that the first memory space needs to be refreshed, a subspace in an idle state is refreshed.

Certainly, during actual implementation, a selection manner is not limited to the foregoing manners, and a quantity of subspaces to which the refresh policy of the first memory space is applied is not limited to one.

By using the refresh processing apparatus provided in this embodiment of this application, the first memory controller no longer independently controls refreshing of the first memory space, but determines the refresh policy of the first memory space by comprehensively considering information about whether a plurality of memory spaces are being forcibly refreshed and whether the plurality of memory spaces are idle indicated by first indication signals and second indication signals of memory spaces correspondingly controlled by the N memory controllers other than the first memory controller in the refresh processing apparatus 600, and the refresh indication information of the first memory space. According to this solution, the first memory controller may consider other memory spaces when determining the refresh policy of the first memory space, and therefore may integrate information about the plurality of memory spaces to determine the refresh policy of the first memory space, thereby improving a probability that the plurality of memory spaces are synchronously refreshed. In a scenario with continuous memory access, according to the solution provided in this embodiment of this application, a probability that any one of the plurality of memory spaces is in a refreshed state can be reduced, to reduce a probability that based on an access request separately sent to a plurality of channels, stream interruption occurs in a system because a memory space is in a refreshed state; and then, memory access efficiency is improved, and system performance is improved.

Figure 7:
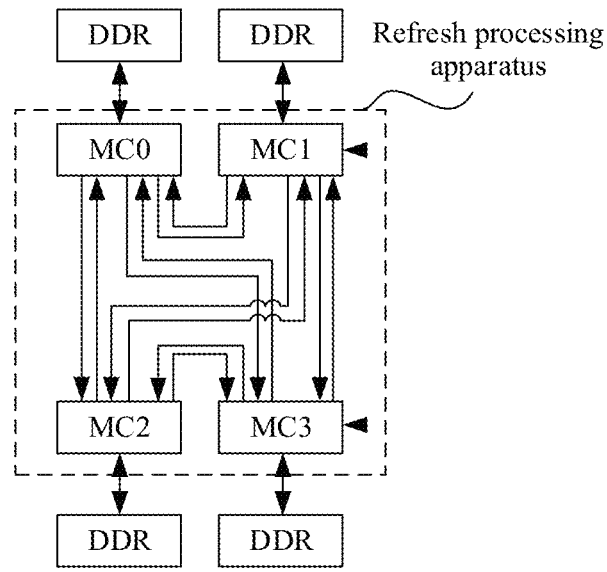
FIG. 7 is a schematic diagram of a structure of another refresh processing apparatus according to an embodiment of this application.

Based on the foregoing embodiment, an embodiment of this application further provides a refresh processing apparatus. The refresh processing apparatus may be considered as a specific example of the refresh processing apparatus shown in FIG. 6. Referring to FIG. 7, the refresh processing apparatus includes four MCs (MC0, MC1, MC2, and MC3). The four MCs are correspondingly connected to four double data rate synchronous dynamic random access memories (DDR SDRAM) (DDR for short) respectively: DDR0, DDR1, DDR2, and DDR3. Each MC is communicatively connected to the other MCs.

In an example of the MC0, the MC0 is configured to output a first indication signal and a second indication signal to the MC1, the MC2, and the MC3. The first indication signal is used to indicate whether the DDR0 is to be forcibly refreshed, and the second indication signal is used to indicate whether the DDR0 is idle. The MC0 is further configured to receive three first indication signals and three second indication signals respectively output by the MC1, the MC2, and the MC3, and determine a refresh policy of the DDR0 based on refresh indication information such as the three first indication signals and the three second indication signals, an under-refresh quantity of times of the DDR0, information about whether the DDR0 is idle, and input and output data traffic of the DDR0.

The MC0 may be considered as a specific example of the first memory controller in the refresh processing apparatus 600, and the DDR0 may be considered as a specific example of the first memory space in the refresh processing apparatus 600. For an implementation and a technical effect that are not described in detail in the refresh processing apparatus shown in FIG. 7, refer to related descriptions in the refresh processing apparatus 600 shown in FIG. 6.

It can be easily learned from FIG. 7 that the refresh processing apparatus provided in this embodiment of this application may be considered as a CPU integrating a plurality of MCs. A difference between the refresh processing apparatus provided in this embodiment of this application and a CPU integrating a plurality of MCs in the prior art lies in that, in the prior art, the plurality of MCs in the CPU separately and independently control refreshing of memory spaces corresponding to the plurality of MCs. In other words, there is no communication connection between the plurality of MCs. However, in this embodiment of this application, any two MCs in a plurality of MCs are communicatively connected, and any MC may determine, based on information about whether memory spaces corresponding to the other MCs are to be forcibly refreshed and whether the memory spaces are idle, and a status of the MC, a refresh policy of a memory space corresponding to the MC. Therefore, the refresh policy of the memory space corresponding to the MC can be determined by integrating information about a plurality of memory spaces, to improve a probability that the plurality of memory spaces are synchronously refreshed, thereby improving memory access efficiency and system performance.

Figure 8:
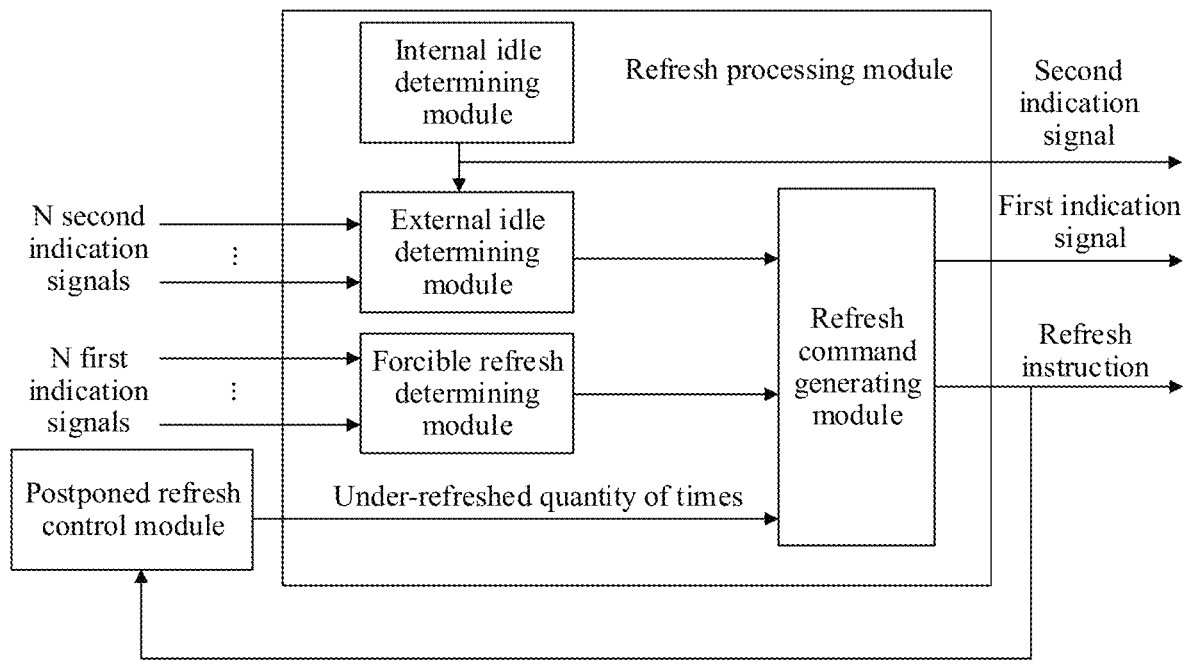
FIG. 8 is a schematic diagram of a structure of a refresh processing module according to an embodiment of this application.

In the refresh processing apparatus provided in this embodiment of this application, in addition to an existing command processing module, data processing module, and refreshing module, the MC further includes a refresh processing module. Referring to FIG. 8, the refresh processing module is configured to determine the refresh policy of the first memory space based on the N first indication signals, the N second indication signals (for example, N is equal to 3 in the refresh processing apparatus shown in FIG. 7), the under-refresh quantity of times and an internal status of the first memory space that are output by a postponed refreshing module, and the like, output a refresh instruction based on the determined refresh policy, and simultaneously outputs a first indication signal and a second indication signal. The refresh instruction is output to the refreshing module in the MC, and the refreshing module may refresh the first memory space based on the refresh instruction. The output first indication signal and second indication signal are used by the N memory controllers other than the first memory controller in the refresh processing apparatus 600 to determine refresh policies of memory spaces correspondingly controlled by the N memory controllers.

Specifically, the refresh processing module may include an internal idle determining module, an idle state determining module, a forcible refresh determining module, and a refresh command generation module. The internal idle determining module is configured to determine whether the first memory space is idle. The idle state determining module is configured to determine, based on whether the first memory space is idle and the N second indication signals, whether there are a plurality of idle memory spaces, and synchronously refresh the plurality of idle memory spaces. The forcible refresh determining module is configured to analyze the N first indication signals, and send an analysis result (for example, which memory spaces in memory spaces corresponding to memory controllers correspondingly indicated in the N first indication signals are being forcibly refreshed) to the refresh command generation module. The refresh command generation module determines a refresh policy based on the analysis result of the forcible refresh determining module, and a status (for example, an idle state or a data transmission state) of another memory space and the under-refresh quantity of times of the first memory space, and outputs a refresh instruction.

The second indication signal output by the first memory controller may be directly determined based on an output result of the internal idle determining module. However, the first indication signal output by the first memory controller needs to be determined based on the refresh policy determined by the refresh command generation module. For example, when the under-refresh quantity of times of the first memory space is greater than or equal to the first threshold, the refresh command generation module determines to forcibly refresh the first memory space, and outputs a first indication signal used to indicate that the first memory space is forcibly refreshed.

In addition, the postponed refreshing module may be a submodule in the refreshing module in the MC. In the prior art, to ensure that an interval of refreshing does not exceed 9tREFI to cause a data loss, the first memory controller records the under-refresh quantity of times of the first memory space by using the postponed refreshing module. In this embodiment of this application, the under-refresh quantity of times of the first memory space may be directly obtained from the postponed refreshing module.

Figure 9:
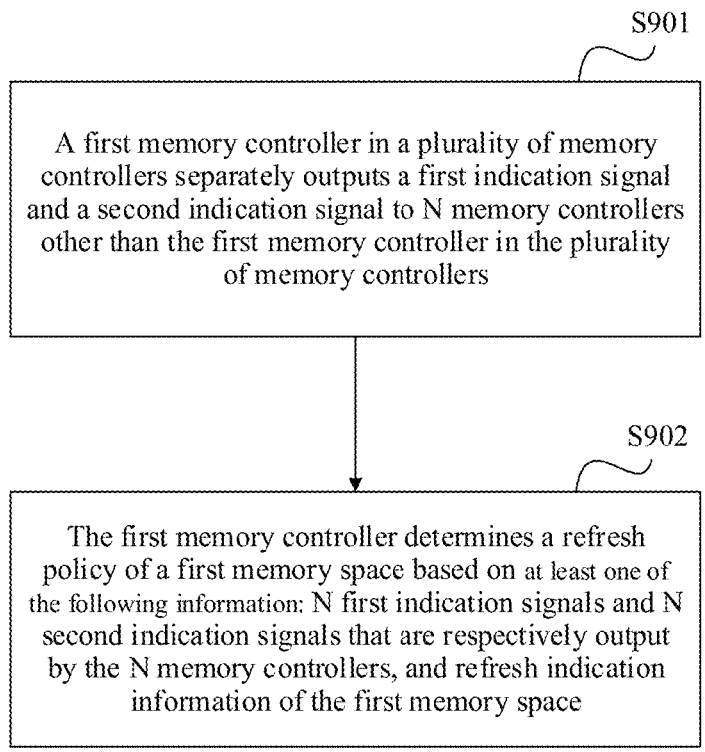
FIG. 9 is a schematic flowchart of a refresh processing method according to an embodiment of this application.

Based on a same inventive concept, an embodiment of this application provides a refresh processing method. The refresh processing method may be considered as a method performed by the first memory controller in the refresh processing apparatus 600 shown in FIG. 6. Referring to FIG. 9, the method includes the following steps.

S901. A first memory controller in a plurality of memory controllers separately outputs a first indication signal and a second indication signal to N memory controllers other than the first memory controller in the plurality of memory controllers.

N is greater than or equal to 1. The first indication signal is used to indicate whether a first memory space controlled by the first memory controller is to be forcibly refreshed, and the second indication signal is used to indicate whether the first memory space is idle. The plurality of memory controllers are in one-to-one correspondence with a plurality of memory spaces, and respectively control the memory spaces corresponding to the plurality of memory controllers, any two of the plurality of memory controllers are communicatively connected, and the first memory controller is any one of the plurality of memory controllers.

S902. The first memory controller determines a refresh policy of the first memory space based on at least one of the following information: N first indication signals and N second indication signals that are respectively output by the N memory controllers, and refresh indication information of the first memory space.

The refresh indication information of the first memory space includes at least one of the following: an under-refresh quantity of times of the first memory space, used to indicate a quantity of times that the first memory space is not refreshed at a preset refresh time; input and output data traffic of the first memory space; and the second indication signal of the first memory controller.

Optionally, that the first memory controller determines the refresh policy of the first memory space includes: If any one of the N first indication signals indicates that a memory space controlled by a corresponding memory controller is being forcibly refreshed, the first memory controller determines to refresh the first memory space.

Optionally, that the first memory controller determines the refresh policy of the first memory space includes: If any one of the N first indication signals indicates that a memory space controlled by a corresponding memory controller is being forcibly refreshed, the first memory controller determines, when the refresh indication information of the first memory space meets a preset condition, to refresh the first memory space.

The preset condition includes at least one of the following: The under-refresh quantity of times is greater than or equal to a preset refresh threshold; the input and output data traffic of the first memory space is less than a preset traffic threshold; and the first memory space is idle.

Optionally, that the first memory controller determines the refresh policy of the first memory space includes: If the under-refresh quantity of times of the first memory space is greater than or equal to a first threshold, the first memory controller determines to forcibly refresh the first memory space.

Optionally, that the first memory controller determines the refresh policy of the first memory space includes: If any one of the N first indication signals indicates that any memory space controlled by a corresponding memory controller is not forcibly refreshed, and the under-refresh quantity of times of the first memory space is greater than or equal to a second threshold and less than the first threshold, the first memory controller determines, when the first memory space is idle, to refresh the first memory space.

Optionally, that the first memory controller determines, when the first memory space is idle, to refresh the first memory space includes: The first memory controller determines idle waiting duration based on the under-refresh quantity of times of the first memory space; and when the first memory space is switched from a data transmission state to an idle state, the first memory controller determines to refresh the first memory space after waiting for the idle waiting duration.

Optionally, that the first memory controller determines to refresh the first memory space includes: If at least one of the N second indication signals indicates that a memory space controlled by a corresponding memory controller is idle, and the first memory space is idle, the first memory controller determines to synchronously refresh the first memory space and at least one second memory space respectively corresponding to the at least one second indication signal.

Optionally, that the first memory controller outputs the first indication signal includes: When the under-refresh quantity of times of the first memory space is greater than or equal to the first threshold, the first memory controller outputs a first indication signal used to indicate that the first memory space is being forcibly refreshed; or when the under-refresh quantity of times of the first memory space is less than the first threshold, the first memory controller outputs a first indication signal used to indicate that the first memory space is not forcibly refreshed.

Optionally, that the first memory controller outputs the first indication signal includes: If the first memory space includes a plurality of subspaces, when any one of the plurality of subspaces is being forcibly refreshed, the first memory controller outputs a first indication signal used to indicate that the first memory space is being forcibly refreshed, or when none of the plurality of subspaces is forcibly refreshed, the first memory controller outputs a first indication signal used to indicate that the first memory space is not forcibly refreshed.

Optionally, that the first memory controller outputs the second indication signal includes: If the first memory space includes a plurality of subspaces, when any one of the plurality of subspaces is idle, the first memory controller outputs a second indication signal used to indicate that the first memory space is idle, or when the plurality of subspaces are all in a data transmission state, the first memory controller outputs a second indication signal used to indicate that the first memory space is not idle.

Optionally, that the first memory controller determines the refresh policy of the first memory space includes: The first memory controller determines the refresh policy of the first memory space based on the N first indication signals and the N second indication signals, and/or refresh indication information of each of the plurality of subspaces. The refresh policy of the first memory space is applied to at least one of the plurality of subspaces.

The refresh indication information of each subspace includes at least one of the following: an under-refresh quantity of times of each subspace, input and output data traffic of each subspace, and whether each subspace is idle.

It should be noted that, the refresh processing method shown in FIG. 9 may be considered as a method performed by the first memory controller in the refresh processing apparatus 600 shown in FIG. 6. For an implementation that is not described in detail in the refresh processing method shown in FIG. 9, refer to related descriptions in refresh processing apparatus 600 shown in FIG. 6.

According to the refresh processing method shown in FIG. 9, the first memory controller no longer independently controls refreshing of the first memory space, but determines the refresh policy of the first memory space by comprehensively considering information about whether a plurality of memory spaces are being forcibly refreshed and whether the plurality of memory spaces are idle indicated by first indication signals and second indication signals of memory spaces correspondingly controlled by the N memory controllers, and the refresh indication information of the first memory space. According to this method, the first memory controller may consider other memory spaces when determining the refresh policy of the first memory space, and therefore may integrate information about the plurality of memory spaces to determine the refresh policy of the first memory space, thereby improving a probability that the plurality of memory spaces are synchronously refreshed. In a scenario with continuous memory access, according to the foregoing method, a probability that any one of the plurality of memory spaces is in a refreshed state can be reduced, to reduce a probability that based on an access request separately sent to a plurality of channels, stream interruption occurs in a system because a memory space is in a refreshed state; and then, memory access efficiency is improved, and system performance is improved.

Figure 10:
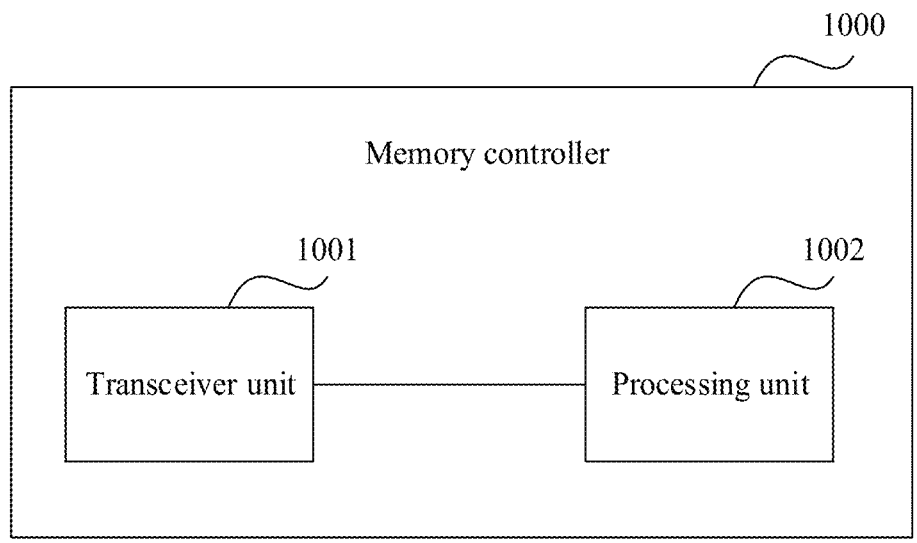
FIG. 10 is a schematic diagram of a structure of a memory controller according to an embodiment of this application.

Based on a same inventive concept, an embodiment of this application further provides a memory controller. The memory controller may be configured to perform the refresh processing method shown in FIG. 9. Referring to FIG. 10, the memory controller 1000 includes a transceiver unit 1001 and a processing unit 1002.

The transceiver unit 1001 is configured to separately output a first indication signal and a second indication signal to N memory controllers other than the memory controller 1000 in a plurality of memory controllers.

N is greater than or equal to 1. The first indication signal is used to indicate whether a first memory space controlled by the memory controller 1000 is to be forcibly refreshed, and the second indication signal is used to indicate whether the first memory space is idle. The plurality of memory controllers are in one-to-one correspondence with a plurality of memory spaces, and respectively control the memory spaces corresponding to the plurality of memory controllers, any two of the plurality of memory controllers are communicatively connected, and the memory controller 1000 is any one of the plurality of memory controllers.

The processing unit 1002 is configured to determine a refresh policy of the first memory space based on at least one of the following information: N first indication signals and N second indication signals that are respectively output by the N memory controllers, and refresh indication information of the first memory space.

The refresh indication information of the first memory space includes at least one of the following: an under-refresh quantity of times of the first memory space, used to indicate a quantity of times that the first memory space is not refreshed at a preset refresh time; input and output data traffic of the first memory space; and the second indication signal of the memory controller 1000.

Optionally, that the processing unit 1002 determines the refresh policy of the first memory space includes: If any one of the N first indication signals indicates that a memory space controlled by a corresponding memory controller is being forcibly refreshed, the processing unit 1002 determines to refresh the first memory space.

Optionally, that the processing unit 1002 determines the refresh policy of the first memory space includes: If any one of the N first indication signals indicates that a memory space controlled by a corresponding memory controller is being forcibly refreshed, the processing unit 1002 determines, when the refresh indication information of the first memory space meets a preset condition, to refresh the first memory space.

The preset condition includes at least one of the following: The under-refresh quantity of times is greater than or equal to a preset refresh threshold; the input and output data traffic of the first memory space is less than a preset traffic threshold; and the first memory space is idle.

Optionally, that the processing unit 1002 determines the refresh policy of the first memory space includes: If the under-refresh quantity of times of the first memory space is greater than or equal to a first threshold, the processing unit 1002 determines to forcibly refresh the first memory space.

Optionally, that the processing unit 1002 determines the refresh policy of the first memory space includes: If any one of the N first indication signals indicates that any memory space controlled by a corresponding memory controller is not forcibly refreshed, and the under-refresh quantity of times of the first memory space is greater than or equal to a second threshold and less than the first threshold, the processing unit 1002 determines, when the first memory space is idle, to refresh the first memory space.

Optionally, that the processing unit 1002 determines, when the first memory space is idle, to refresh the first memory space includes: The processing unit 1002 determines idle waiting duration based on the under-refresh quantity of times of the first memory space; and when the first memory space is switched from a data transmission state to an idle state, the processing unit 1002 determines to refresh the first memory space after waiting for the idle waiting duration.

Optionally, that the processing unit 1002 determines to refresh the first memory space includes: If at least one of the N second indication signals indicates that a memory space controlled by a corresponding memory controller is idle, and the first memory space is idle, the processing unit 1002 determines to synchronously refresh the first memory space and at least one second memory space respectively corresponding to the at least one second indication signal.

Optionally, that the transceiver unit 1001 outputs the first indication signal includes: When the under-refresh quantity of times of the first memory space is greater than or equal to the first threshold, the transceiver unit 1001 outputs a first indication signal used to indicate that the first memory space is being forcibly refreshed; or when the under-refresh quantity of times of the first memory space is less than the first threshold, the transceiver unit 1001 outputs a first indication signal used to indicate that the first memory space is not forcibly refreshed.

Optionally, that the transceiver unit 1001 outputs the first indication signal includes: If the first memory space includes a plurality of subspaces, when any one of the plurality of subspaces is being forcibly refreshed, the transceiver unit 1001 outputs a first indication signal used to indicate that the first memory space is being forcibly refreshed, or when none of the plurality of subspaces is forcibly refreshed, the transceiver unit 1001 outputs a first indication signal used to indicate that the first memory space is not forcibly refreshed.

Optionally, that the transceiver unit 1001 outputs the second indication signal includes: If the first memory space includes a plurality of subspaces, when any one of the plurality of subspaces is idle, the transceiver unit 1001 outputs a second indication signal used to indicate that the first memory space is idle, or when the plurality of subspaces are all in a data transmission state, the transceiver unit 1001 outputs a second indication signal used to indicate that the first memory space is not idle.

Optionally, that the processing unit 1002 determines the refresh policy of the first memory space includes: The processing unit 1002 determines the refresh policy of the first memory space based on the N first indication signals and the N second indication signals, and/or refresh indication information of each of the plurality of subspaces. The refresh policy of the first memory space is applied to at least one of the plurality of subspaces.

The refresh indication information of each subspace includes at least one of the following: an under-refresh quantity of times of each subspace, input and output data traffic of each subspace, and whether each subspace is idle.

It should be noted that, in this embodiment of this application, unit division is an example, and is merely logical function division. During actual implementation, another division manner may be used. Functional units in this embodiment of this application may be integrated into one processing unit, or each of the units may exist alone physically, or at least two units are integrated into one unit. The integrated units may be implemented in a form of hardware, or may be implemented in a form of a software functional unit.

When the integrated unit is implemented in the form of a software functional unit and sold or used as an independent product, the integrated unit may be stored in a computer-readable storage medium. Based on such understanding, the technical solutions of this application essentially, or the part contributing to the prior art, or all or some of the technical solutions may be implemented in a form of a software product. The computer software product is stored in a storage medium and includes several instructions for instructing a computer device (which may be a personal computer, a server, a network device, or the like) or a processor to perform all or some of the steps of the methods described in the embodiments of this application. The foregoing storage medium includes: any medium that can store program code, such as a USB flash drive, a removable hard disk, a random access memory (RAM), a read-only memory (ROM), a magnetic disk, or an optical disc.

It should also be noted that the memory controller 1000 may implement the method provided in the embodiment corresponding to FIG. 9. For an implementation that is not described in detail in the memory controller 1000, refer to related descriptions in the method provided in the embodiment corresponding to FIG. 9.

Figure 11:
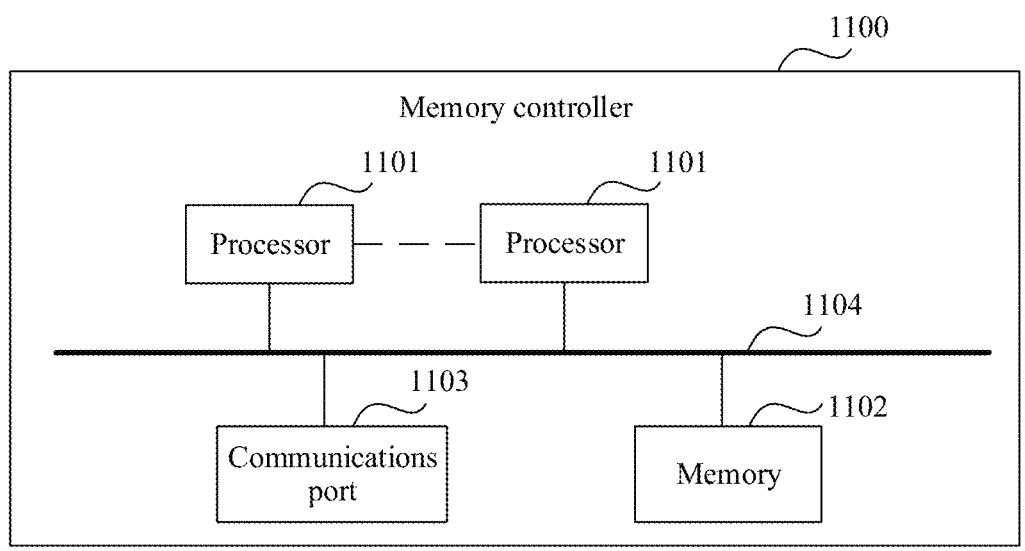
FIG. 11 is a schematic diagram of a structure of another memory controller according to an embodiment of this application.

Based on a same inventive concept, an embodiment of this application provides a memory controller. The memory controller may be configured to perform the refresh processing method shown in FIG. 9, and may be a same device as the memory controller 1000 shown in FIG. 10. Referring to FIG. 11, the memory controller 1100 includes at least one processor 1101, a memory 1102, and a communications interface 1103. The at least one processor 1101, the memory 1102, and the communications interface 1103 are all connected by using a bus 1104.

The memory 1102 is configured to store a computer-executable instruction.

The at least one processor 1101 is configured to execute a computer-executable instruction stored in the memory 1102, so that the memory controller 1100 exchanges data with another component (for example, another memory controller) in a system by using the communications interface 1103, to perform the refresh processing method provided in the foregoing embodiment, or the memory controller 1100 exchanges data with another component (for example, another memory controller) in a system by using the communications interface 1103, to implement some or all functions of the system.

The at least one processor 1101 may include different types of processors 1101, or include a same type of processor 1101. The processor 1101 may be any one of the following: a CPU, an ARM processor, a field programmable gate array (FPGA), a dedicated processor, or another device having a computing processing capability. In an optional implementation, the at least one processor 1101 may be integrated into a many-core processor.

The memory 1102 may be any one or any combination of the following storage mediums: a RAM, a ROM, a non-volatile memory (NVM), a solid state drive (SSD), a mechanical hard disk, a magnetic disk, a magnetic disk array, and the like.

The communications interface 1103 is used by the memory controller 1100 to exchange data with another component (for example, another memory controller). The communications interface 1103 may be any one or any combination of the following devices with a network access function: a network interface (for example, an Ethernet interface), a wireless network interface card, and the like.

The bus 1104 may include an address bus, a data bus, a control bus, and the like. For ease of denotation, the bus is represented by using a thick line in FIG. 11. The bus 1104 may be any one or any combination of the following devices for wired data transmission: an industry standard architecture (ISA) bus, a peripheral component interconnect (PCI) bus, an extended industry standard architecture (EISA) bus, and the like.

Figure 12:
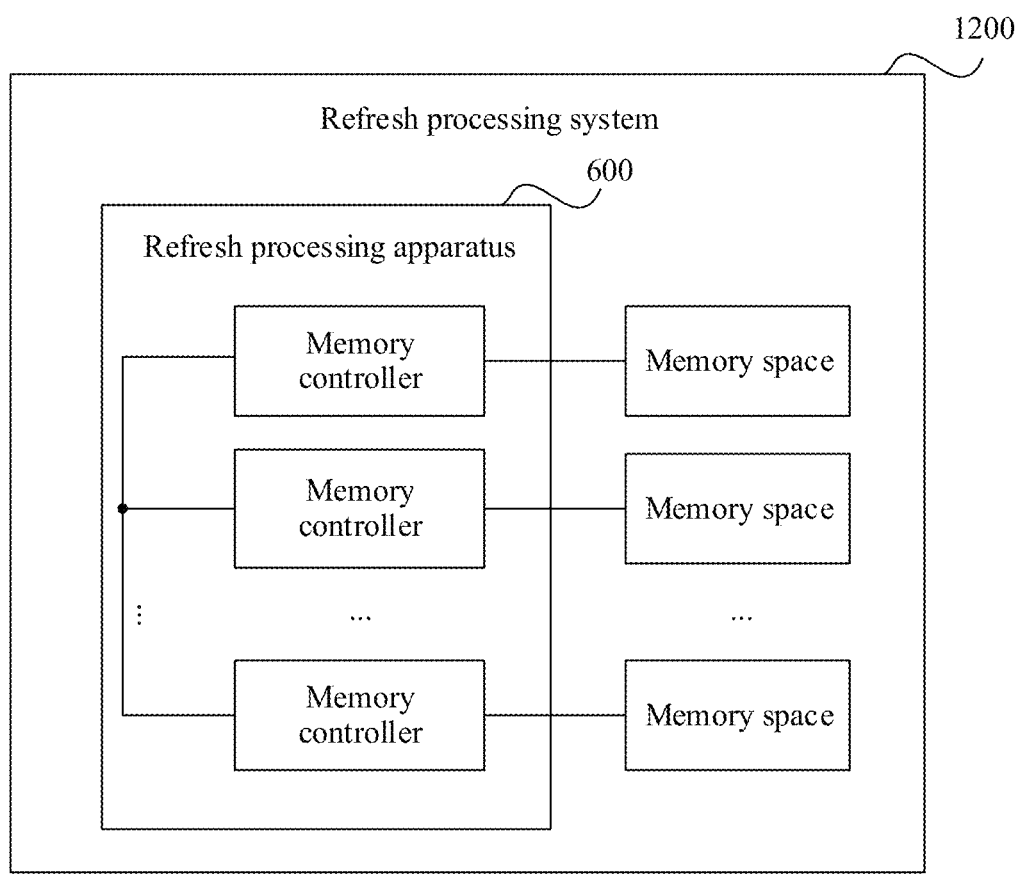
FIG. 12 is a schematic diagram of a structure of a refresh processing system according to an embodiment of this application.

In addition, an embodiment of this application further provides a refresh processing system. Referring to FIG. 12, the refresh processing system 1200 includes the refresh processing apparatus 600 and the plurality of memory spaces that are shown in FIG. 6. The refresh processing apparatuses 600 includes a plurality of memory controllers. The plurality of memory controllers are in one-to-one correspondence with a plurality of memory spaces, and respectively control the memory spaces corresponding to the plurality of memory controllers, to implement refresh processing method shown in FIG. 9.

In conclusion, the embodiments of this application provide a refresh processing method, apparatus, and system, and a memory controller. According to the solutions provided in the embodiments of this application, the refresh policy of the first memory space may be determined by integrating information about the plurality of memory spaces, to improve the probability that the plurality of memory spaces are synchronously refreshed. In a scenario with continuous memory access, according to the solutions provided in the embodiments of this application, a probability that any one of the plurality of memory spaces is in a refreshed state can be reduced, to reduce a probability that based on an access request separately sent to a plurality of channels, stream interruption occurs in a system because a memory space is in a refreshed state; and then, memory access efficiency is improved, and system performance is improved.

This application is described with reference to the flowcharts and/or the block diagrams of the method, the device (system), and the computer program product based on this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a special-purpose computer, an embedded processor, or a processor of another programmable data processing device to generate a machine, so that the instructions executed by a computer or the processor of another programmable data processing device generate an apparatus for implementing a specific function in one or more processes in the flowcharts and/or in one or more blocks in the block diagrams.

These computer program instructions may alternatively be stored in a computer-readable memory that can instruct a computer or another programmable data processing device to work in a specific manner, so that the instructions stored in the computer-readable memory generate an artifact that includes an instruction apparatus. The instruction apparatus implements a specific function in one or more processes in the flowcharts and/or in one or more blocks in the block diagrams.

These computer program instructions may alternatively be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Definitely, a person skilled in the art can make various modifications and variations to this application without departing from the spirit and scope of this application. This application is intended to cover these modifications and variations of this application provided that they fall within the scope of protection defined by the following claims and their equivalent technologies.

All or some of the foregoing embodiments may be implemented by using software, hardware, firmware, or any combination thereof. When the embodiments are implemented by using software, all or some of the embodiments may be implemented in a form of a computer program product. The computer program product includes one or more computer instructions. When the computer program instruction is loaded and executed on a computer, the procedure or function according to the embodiments of the present invention are all or partially generated. The computer may be a general-purpose computer, a special-purpose computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible to a computer, or a data storage device, such as a server or a data center, integrating one or more usable mediums. The usable medium may be a magnetic medium (for example, a floppy disk, a hard disk, or a magnetic tape), an optical medium (for example, a DVD), a semiconductor medium (for example, an SSD), or the like.

What is claimed is:

1. A refresh processing apparatus, comprising a plurality of memory controllers, wherein the plurality of memory controllers are in one-to-one correspondence with a plurality of memory spaces, and respectively control the memory spaces corresponding to the plurality of memory controllers, and any two of the plurality of memory controllers are communicatively connected;

wherein a first memory controller in the plurality of memory controllers is configured to:

receive N first indication signals and N second indication signals that are output by –N memory controllers other than the first memory controller in the plurality of memory controllers, wherein N is greater than or equal to 1, any one of the N first indication signals is used to indicate whether a memory space controlled by a corresponding memory controller is to be forcibly refreshed, and any one of the N second indication signals is used to indicate whether a memory space controlled by a corresponding memory controller is idle; and determine a refresh policy of a first memory space controlled by the first memory controller based on at least one of the following information: the N first indication signals, the N second indication signals, and refresh indication information of the first memory space, wherein the refresh indication information of the first memory space comprises at least one of the following: an under-refresh quantity of times of the first memory space, used to indicate a quantity of times that the first memory space is not refreshed at a preset refresh time; input and output data traffic of the first memory space; and the second indication signal of the first memory controller; and the first memory controller is any one of the plurality of memory controllers.

2. The apparatus according to claim 1, wherein when determining the refresh policy of the first memory space, the first memory controller is configured to:

if any one of the N first indication signals indicates that a memory space controlled by a corresponding memory controller is being forcibly refreshed, determine to refresh the first memory space.

3. The apparatus according to claim 1, wherein when determining the refresh policy of the first memory space, the first memory controller is configured to:

when any one of the N first indication signals indicates that a memory space controlled by a corresponding memory controller is being forcibly refreshed, determine, when the refresh indication information of the first memory space meets a preset condition, to refresh the first memory space.

4. The apparatus according to claim 3, wherein the preset condition comprises at least one of the following:

the under-refresh quantity of times is greater than or equal to a preset refresh threshold;

the input and output data traffic of the first memory space is less than a preset traffic threshold; and the first memory space is idle.

5. The apparatus according to claim 1, wherein when determining the refresh policy of the first memory space, the first memory controller is configured to:

when the under-refresh quantity of times of the first memory space is greater than or equal to a first threshold, determine to forcibly refresh the first memory space.

6. The apparatus according to claim 1, wherein when determining the refresh policy of the first memory space, the first memory controller is configured to:

when any one of the N first indication signals indicates that any memory space controlled by a corresponding memory controller is not forcibly refreshed, and the under-refresh quantity of times of the first memory space is greater than or equal to a second threshold and less than the first threshold, determine to refresh the first memory space when the first memory space is idle.

7. The apparatus according to claim 6, wherein when determining to refresh the first memory space when the first memory space is idle, the first memory controller is configured to:

determine an idle waiting duration based on the under-refresh quantity of times of the first memory space; and when the first memory space is switched from a data transmission state to an idle state, determine to refresh the first memory space after waiting for the idle waiting duration.

8. The apparatus according to claim 1, wherein when determining to refresh the first memory space, the first memory controller is configured to:

when at least one of the N second indication signals indicates that a memory space controlled by a corresponding memory controller is idle, and the first memory space is idle, determine to synchronously refresh the first memory space and at least one second memory space respectively corresponding to the at least one second indication signal.

9. A refresh processing method, comprising:

receiving, by a first memory controller in a plurality of memory controllers, N first indication signals and N second indication signals that are output by N memory controllers other than the first memory controller in the plurality of memory controllers, wherein N is greater than or equal to 1, any one of the N first indication signals is used to indicate whether a memory space controlled by a corresponding memory controller is to be forcibly refreshed, and any one of the N second indication signals is used to indicate whether a memory space controlled by a corresponding memory controller is idle; and wherein the plurality of memory controllers are in one-to-one correspondence with a plurality of memory spaces, and respectively control the memory spaces corresponding to the plurality of memory controllers, any two of the plurality of memory controllers are communicatively connected, and the first memory controller is any one of the plurality of memory controllers; and determining, by the first memory controller, a refresh policy of a first memory space controlled by the first memory controller based on at least one of the following information: the N first indication signals, the N second indication signals, and refresh indication information of the first memory space, wherein the refresh indication information of the first memory space comprises at least one of the following: an under-refresh quantity of times of the first memory space, used to indicate a quantity of times that the first memory space is not refreshed at a preset refresh time; input and output data traffic of the first memory space; and the second indication signal of the first memory controller.

10. The method according to claim 9, wherein the determining, by the first memory controller, a refresh policy of the first memory space comprises:

when any one of the N first indication signals indicates that a memory space controlled by a corresponding memory controller is being forcibly refreshed, determining, by the first memory controller, to refresh the first memory space.

11. The method according to claim 9, wherein the determining, by the first memory controller, a refresh policy of the first memory space comprises:

when any one of the N first indication signals indicates that a memory space controlled by a corresponding memory controller is being forcibly refreshed, determining, by the first memory controller when the refresh indication information of the first memory space meets a preset condition, to refresh the first memory space.

12. The method according to claim 11, wherein the preset condition comprises at least one of the following:
the under-refresh quantity of times is greater than or equal to a preset refresh threshold;
the input and output data traffic of the first memory space is less than a preset traffic threshold; and
the first memory space is idle.

13. The method according to claim 9, wherein the determining, by the first memory controller, a refresh policy of the first memory space comprises:
when the under-refresh quantity of times of the first memory space is greater than or equal to a first threshold, determining, by the first memory controller, to forcibly refresh the first memory space.

14. The method according to claim 9, wherein the determining, by the first memory controller, a refresh policy of the first memory space comprises:
when any one of the N first indication signals indicates that any memory space controlled by a corresponding memory controller is not forcibly refreshed, and the under-refresh quantity of times of the first memory space is greater than or equal to a second threshold and less than the first threshold, determining, by the first memory controller, to refresh the first memory space when the first memory space is idle.

15. The method according to claim 14, wherein the determining, by the first memory controller, to refresh the first memory space when the first memory space is idle comprises:
determining, by the first memory controller, an idle waiting duration based on the under-refresh quantity of times of the first memory space; and
when the first memory space is switched from a data transmission state to an idle state, determining, by the first memory controller, to refresh the first memory space after waiting for the idle waiting duration.

16. The method according to claim 9, wherein the determining, by the first memory controller, to refresh the first memory space comprises:
when at least one of the N second indication signals indicates that a memory space controlled by a corresponding memory controller is idle, and the first memory space is idle, determining, by the first memory controller, to synchronously refresh the first memory space and at least one second memory space respectively corresponding to the at least one second indication signal.

* * * * *